(12) United States Patent
Marbell et al.

(10) Patent No.: US 11,967,936 B2
(45) Date of Patent: Apr. 23, 2024

(54) OUTPUT-INTEGRATED TRANSISTOR DEVICE PACKAGES

(71) Applicant: MACOM Technology Solutions Holdings, Inc., Lowell, MA (US)

(72) Inventors: Marvin Marbell, Cary, NC (US); Jonathan Chang, Morgan Hill, CA (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 411 days.

(21) Appl. No.: 17/313,616

(22) Filed: May 6, 2021

(65) Prior Publication Data

US 2022/0360233 A1 Nov. 10, 2022

(51) Int. Cl.
| | | |
|---|---|---|
| *H03F 3/68* | (2006.01) | |
| *H01L 23/047* | (2006.01) | |
| *H01L 23/66* | (2006.01) | |
| *H03F 1/02* | (2006.01) | |
| *H03F 1/56* | (2006.01) | |
| *H03F 3/21* | (2006.01) | |

(52) U.S. Cl.
CPC ............ *H03F 1/56* (2013.01); *H01L 23/047* (2013.01); *H01L 23/66* (2013.01); *H03F 1/0288* (2013.01); *H03F 3/211* (2013.01); *H01L 2223/6611* (2013.01); *H01L 2223/6655* (2013.01); *H03F 2200/451* (2013.01)

(58) Field of Classification Search
CPC .......... H03F 1/56; H03F 1/0288; H03F 3/211; H03F 2200/451; H03F 3/195; H03F 3/68; H03F 3/602; H03F 3/60; H03F 3/607; H01L 23/047; H01L 23/66; H01L 2223/6611; H01L 2223/6655; H01L 2223/6644
USPC ..................................... 330/124 R, 285, 295
See application file for complete search history.

(56) References Cited

U.S. PATENT DOCUMENTS

| | | | |
|---|---|---|---|
| 8,022,760 B2 | 9/2011 | Gajadharsing et al. | |
| 8,253,494 B2 * | 8/2012 | Blednov | H03F 1/0288 330/124 R |
| 8,324,965 B2 | 12/2012 | Meng | |
| 9,325,280 B2 | 4/2016 | Blednov et al. | |
| 9,438,191 B2 * | 9/2016 | Blednov | H03F 3/195 |
| 9,628,032 B1 | 4/2017 | Marbell et al. | |
| 9,917,551 B2 * | 3/2018 | McLaren | H03F 3/195 |
| 10,438,908 B2 * | 10/2019 | Roiz | H01L 23/047 |
| 11,088,661 B2 * | 8/2021 | Hill | H03F 3/195 |
| 11,146,220 B2 * | 10/2021 | Zhang | H03F 1/3288 |
| 11,621,673 B2 * | 4/2023 | Nanan | H01L 24/49 330/295 |
| 2017/0026001 A1 | 1/2017 | Moronval et al. | |

(Continued)

OTHER PUBLICATIONS

Cripps, S.C., "Advanced Techniques in RF Power Amplifier Design", (Chapter 2), Norwood, MA: Artech House, 2002.

(Continued)

*Primary Examiner* — Khanh V Nguyen
(74) *Attorney, Agent, or Firm* — Myers Bigel, P.A.

(57) ABSTRACT

A semiconductor device package includes a plurality of input leads, a plurality of transistor amplifier dies having inputs respectively coupled to the plurality of input leads, and a combined output lead configured to combine output signals received from the plurality of transistor amplifier dies and output a combined signal.

23 Claims, 17 Drawing Sheets

(56) References Cited

U.S. PATENT DOCUMENTS

2017/0230009 A1    8/2017   Moronval et al.
2020/0304074 A1    9/2020   Jang et al.

OTHER PUBLICATIONS

I. Blednov, "Wideband 3 Way Doherty RFIC with 12 dB Back-Off power range", Proceedings of the 11th European Microwave Integrated Circuits Conference, Oct. 3-4, 2016, London UK, pp. 17-20.

* cited by examiner

OUTPUT-INTEGRATED TRANSISTOR DEVICE PACKAGES

FIELD

The present disclosure relates to transistor devices and, more particularly, to transistor amplifiers and related device packages.

BACKGROUND

Electrical circuits requiring high power handling capability while operating at high frequencies, such as R-band (0.5-1 GHz), S-band (3 GHz), X-band (10 GHz), Ku-band (12-18 GHz), K-band (18-27 GHz), Ka-band (27-40 GHz) and V-band (40-75 GHz) have become more prevalent. In particular, there is now a high demand for radio frequency ("RF") transistor amplifiers that are used to amplify RF signals at frequencies of, for example, 500 MHz and higher (including microwave frequencies). These RF transistor amplifiers may need to exhibit high reliability, good linearity, high efficiency, and handle high output power levels.

Some transistor amplifiers are implemented in silicon or wide bandgap semiconductor materials, such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based transistor amplifiers are often implemented using laterally diffused metal oxide semiconductor ("LD-MOS") transistors. Silicon LDMOS transistor amplifiers can exhibit high levels of linearity and may be relatively inexpensive to fabricate. Group III nitride-based transistor amplifiers are often implemented as High Electron Mobility Transistors ("HEMT") and are primarily used in applications requiring high power and/or high frequency operation where LDMOS transistor amplifiers may have inherent performance limitations.

Transistor amplifier packages may include one or more amplification stages, with each stage typically implemented as a transistor amplifier chip or "die." In order to increase the output power and current handling capabilities, transistor amplifier dies are typically implemented in a "unit cell" configuration in which a large number of individual "unit cell" transistors are arranged electrically in parallel. A transistor amplifier package may be implemented as a single die or may include a plurality of dies.

Transistor amplifiers packages are often integrated with matching circuits, such as (1) impedance matching circuits that are designed to improve the impedance match (for signals at the fundamental operating frequency of the amplifier) between the transistor die and transmission lines connected thereto and (2) harmonic termination circuits that are designed to at least partly terminate harmonics that may be generated during device operation, such as second and third order harmonics. The transistor die(s) as well as the impedance matching and harmonic termination circuits may be enclosed in a package. Electrical leads may extend from the package that are used to electrically connect the transistor die to external circuit elements such as input and output transmission lines and bias voltage sources.

The design of modern telecommunication systems may need to deliver a wide range of output power levels with high efficiency and high linearity. Traditionally, such systems would include a balanced transistor amplifier configured to handle the highest power level with maximum available efficiency. As a result, when the system is operating at less than maximum power, which may include a large portion of the operation cycle, the overall efficiency of the system may be lowered.

One type of transistor amplifier package that can address this issue is a Doherty amplifier. The Doherty amplifier can accommodate signals with high peak-to-average power ratios by using two amplifier circuits to accommodate different signal levels. In this way, the amplifier achieves a high level of linearity while retaining good power efficiency over a range of signal levels. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split into multiple sub-components (e.g., using a quadrature coupler), and the sub-components are fed to respective amplifiers. The outputs of the amplifiers are then combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

FIG. 1 is a schematic diagram of a two-way Doherty transistor amplifier 10. As shown in FIG. 1, the Doherty transistor amplifier 10 includes an RF input 11, an input splitter 13, a main amplifier 14, a peaking amplifier 15, an output combiner 18 and an RF output 19. The Doherty transistor amplifier 10 may optionally include input matching networks and/or output matching networks (not shown).

In some embodiments, the input splitter 13 may change the relative phases of the signals provided to the main amplifier 14 and the peaking amplifier 15. For example, in some embodiments, the signal provided to the main amplifier 14 may be 90 degrees out of phase with the signals provided to the peaking amplifier 15. Similarly, in some embodiments, the output combiner 18 may, in some embodiments, include output phasing lines and be configured to adjust the phase of the output of the main amplifier 14 and/or the peaking amplifier 15.

In FIG. 1, the Doherty amplifier 10 includes only two amplifiers, but Doherty amplifiers may include different numbers (e.g., N) of peak and main amplifiers. For example, FIG. 2 is a schematic diagram of a three-way Doherty amplifier 30. It will be understood that only 3 amplifiers are shown, but the number of amplifiers could be higher. As shown in FIG. 2, the three-way Doherty transistor amplifier 30 includes an RF input 31, a first input splitter 13_1, a second input splitter 13_2, a main amplifier 14, a first peaking amplifier 15_1, a second peaking amplifier 15_2, a first output combiner 18_1, a second output combiner 18_2, and an RF output 39. The main amplifier 14, the first peaking amplifier 15_1, and the second peaking amplifier 15_2 are often implemented as separate packaged transistor devices.

The RF input 31 may be coupled to the first input splitter 13_1. A first output of the first input splitter 13_1 may be coupled to the main amplifier 14 and a second output of the first input splitter 13_1 may be coupled to the second input splitter 13_2. As with the Doherty amplifier 10 of FIG. 1, the outputs of the first input splitter 13_1 may be separated in phase by 90 degrees. The outputs of the second input splitter 13_2 may be coupled to the first peaking amplifier 15_1 and the second peaking amplifier 15_2. The inputs to the first and second peaking amplifiers 15_1, 15_2 may also be out of phase with one another.

The outputs of the main amplifier 14, first peaking amplifier 15_1, and second peaking amplifier 15_2 may be combined in a staged fashion. For example, the outputs of the first peaking amplifier 15_1 and second peaking amplifier 15_2 may be coupled to the second output combiner 18_2. The output of the main amplifier 14 and the output of the second output combiner 18_2 may be coupled to the first output combiner 18_1, which provides the RF output 39. The first output combiner 18_1 and/or the second output combiner 18_2 may be configured to convert a phase of one or more of the signals input to the combiner.

FIG. 2 also includes an input and output matching network. For example, an input match circuit 32 may be respectively coupled to inputs of each of the main amplifier 14, the first peaking amplifier 15_1, and the second peaking amplifier 15_2. An output match circuit 34 may be respectively coupled to outputs of each of the main amplifier 14, the first peaking amplifier 15_1, and the second peaking amplifier 15_2. The input match circuits 32 and/or the output match circuits 34 may be configured to perform impedance matching and/or harmonic termination for received signals. Each of the input match circuits 32 and each of the output match circuits 34 may be configured to receive a bias signal configured to bias the elements of the respective circuit.

In order to improve the performance of the 3-way Doherty amplifier 30, each of the input match circuits 32 and/or the output match circuits 34 may need to be configured separately. That is to say that the elements of a first input match circuit 32 may be different from those of a second input match circuit 32. Similarly, the elements of a first output match circuit 34 may be different from those of a second output match circuit 34. The configuration of the input match circuits 32 and/or the output match circuits 34 may be dependent on the frequency range of operation and/or the provided load to which the 3-way Doherty amplifier 30 is connected. Moreover, as noted above, each of the input match circuits 32 and/or the output match circuits 34 may be coupled to a separate bias signal. Thus, configuring the 3-way Doherty amplifier 30 may be complex and lacking in flexibility, and the space used to contain the number of circuits, including the splitters, combiners, input match circuits, output match circuits, and bias wiring may be limiting. The latter challenge can be an issue as the need for smaller devices with higher integration increases. As the number of amplifiers in the Doherty combination increases (e.g., to more than two or three amplifiers), the issues related to complexity and package size increase as well.

SUMMARY

Pursuant to embodiments of the present invention, a semiconductor device package includes: a plurality of input leads; a plurality of transistor amplifier dies having inputs respectively coupled to the plurality of input leads; and a combined output lead configured to combine output signals received from the plurality of transistor amplifier dies and output a combined signal.

In some embodiments, the plurality of transistor amplifier dies are second transistor amplifier dies, the plurality of input leads are a plurality of second input leads, and the semiconductor device package further includes: a first input lead; a first output lead separate from the combined output lead; and a first transistor amplifier die coupled between the first input lead and the first output lead.

In some embodiments, the first transistor amplifier die is a main amplifier of a Doherty amplifier and the plurality of second transistor amplifier dies are peaking amplifiers of the Doherty amplifier.

In some embodiments, at least a portion of the combined output lead is within the semiconductor device package.

In some embodiments, the combined output lead comprises an internal portion that is within the semiconductor device package and a protrusion that extends from the internal portion out of the semiconductor device package.

In some embodiments, the protrusion is a first protrusion, and the combined output lead comprises a second protrusion, separated from the first protrusion, that extends from the internal portion of the combined output lead out of the semiconductor device package.

In some embodiments, the semiconductor device further includes a plurality of output prematch circuits respectively between ones of the plurality of transistor amplifier dies and the combined output lead.

In some embodiments, a width of the combined output lead extends from a portion of an interior of the semiconductor device package that is adjacent a first of the plurality of transistor amplifier dies to a portion of the interior of the semiconductor device package that is adjacent a second of the plurality of transistor amplifier dies.

In some embodiments, the combined output lead extends to at least partially overlap each of the plurality of transistor amplifier.

In some embodiments, the plurality of input leads are configured to receive a plurality of input signals that are respectively out of phase with one another.

Pursuant to embodiments of the present invention, a semiconductor device package includes: a first transistor amplifier die coupled to a first input lead of the semiconductor device package; a plurality of second transistor amplifier dies respectively coupled to a plurality of second input leads of the semiconductor device package; and a combined output lead that is configured to output a combination of output signals of respective ones of the plurality of second transistor amplifier dies.

In some embodiments, the semiconductor device package is a Doherty amplifier package, the plurality of second transistor amplifier dies comprise a first peaking transistor amplifier and a second peaking transistor amplifier of the Doherty amplifier package, and the first transistor amplifier die comprises a main amplifier of the Doherty amplifier package.

In some embodiments, the combined output lead is further configured to combine the output of the first transistor amplifier die with the combination of the output of the plurality of second transistor amplifier dies.

In some embodiments, the combined output lead comprises a first output lead and a second output lead electrically coupled together.

In some embodiments, the first output lead and the second output lead are electrically coupled together by bond wires.

In some embodiments, the combined output lead comprises an internal portion that is within the semiconductor device package and a protrusion that extends from the internal portion out of the semiconductor device package.

In some embodiments, the semiconductor device further includes an output prematch circuit between respective ones of the plurality of second transistor amplifier dies and the combined output lead.

Pursuant to embodiments of the present invention, a semiconductor device package includes: a plurality of transistor amplifier dies, each respectively coupled to one of a plurality of input leads of the semiconductor device package; and a combined output lead configured to combine output signals from two or more of the plurality of transistor amplifier dies to generate a combined output signal that is provided as an output of the semiconductor device package.

In some embodiments, the combined output lead extends to at least partially overlap each of the plurality of transistor amplifier dies.

In some embodiments, the semiconductor device further includes a plurality of output prematch circuits respectively between ones of the plurality of transistor amplifier dies and the combined output lead.

In some embodiments, the plurality of transistor amplifier dies are second transistor amplifier dies, the plurality of input leads are a plurality of second input leads, and the semiconductor device package further includes: a first input lead; a first output lead separate from the combined output lead; and a first transistor amplifier die coupled between the first input lead and the first output lead.

In some embodiments, the first transistor amplifier die is a main amplifier of a Doherty amplifier and the plurality of second transistor amplifier dies are peaking amplifiers of the Doherty amplifier.

In some embodiments, the combined output lead is further configured to combine the output signals from the two or more of the plurality of second transistor amplifier dies with an output signal of the first transistor amplifier die to generate the combined output signal.

DETAILED DESCRIPTION

Figure 1:
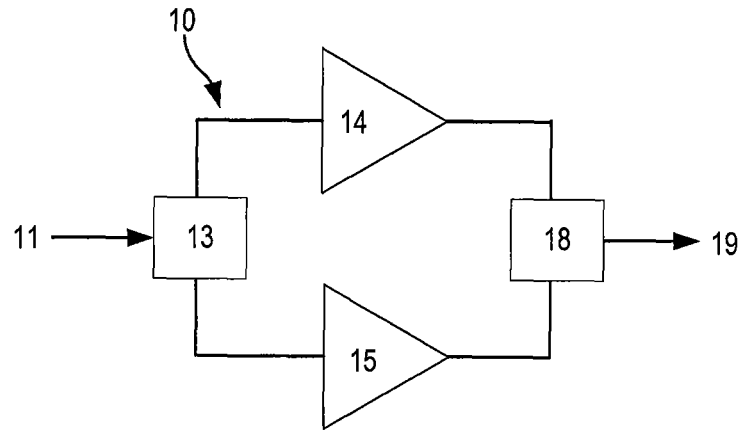
FIG. 1 is a schematic diagram of a Doherty transistor amplifier.

The present disclosure describes methods and devices in which the output of a plurality of the transistor dies of a package (e.g., one or more peaking amplifiers) are combined inside a packaged device using a combined output lead that connects the outputs of the transistor dies along an edge plane. As an example, a packaged device may be a 3-way packaged amplifier configured as a Doherty amplifier, with three input RF leads, and two output RF leads. The output signals of two of the transistor dies of the package (e.g., the peaking amplifiers in a Doherty configuration) may be Doherty combined by a common lead (also referred to herein as a combined output lead) of the package. By utilizing such a configuration, the output matching network external to the package (which can be configured with PCB components) can be done with the ease and flexibility of a 2-way Doherty, while the input side matching may still be implemented as a 3-way Doherty. The configuration may provide a simpler and more flexible output matching circuit (on the output side), while maintaining the benefits of a 3-way Doherty. The present disclosure is not limited to a Doherty amplifier. In some embodiments, the internal output combination may be utilized to provide other types of amplifier configurations while allowing for simpler and less complex output matching.

Embodiments of the present disclosure may provide beneficial solutions over packaged devices incorporating multiple transistor dies. Referring back to FIG. 2, it can be seen that N-way Doherty amplifiers can provide challenges to circuit design. Using a three-way Doherty amplifier as an example, the three-way Doherty amplifier may provide improved efficiency at higher back-off power levels (e.g., 9.5 dB), but the typical solutions involve three separate package devices which may increase the cost of the overall solution. In addition, 90 and 180 degree phasing lines (e.g., to combine the outputs signals from all of the amplifiers) may be needed at the output side of the device to combine the output signals of the amplifiers, which may increase the complexity of the design and/or lead to narrow band performance.

One potential solution to minimize the cost of such a configuration is to integrate the second and third packaged amplifiers (e.g., the peaking amplifiers) into one package, but with two separate input and output leads (i.e., a push-pull packaged amplifier). While this may provide a small improvement in the cost, the close proximity of the second and third leads may worsen the circuit complexity problem, and may worsen the narrow band response problem. The narrower spacing of the leads may reduce the amount of area to provide output matching and/or combining circuits, without reducing the complexity of the output matching and/or combining circuits.

Another potential solution is to integrate all three amplifier stages onto one package, with three separate input and output leads. This may further decrease the cost, but may also increase the circuit complexity. The output leads may have to be very narrow to avoid isolation problems, and there may be little room left for the output matching circuit of each amplifier and the 90/180 degree combining lines, thus leading to a narrow band design.

Some methods that may be used to minimize the adverse effects of poor isolation between the adjacent leads involve leaving a bigger gap between the leads or inserting a ground strip. Either of those methods may leave less space for the leads, which may result in even narrower leads and worse RF performance.

Another alternative is to use a 2-way Doherty architecture with a high asymmetry ratio, but this may have a non-desirable efficiency versus power profile, and may also be very non-linear. Such a solution may relinquish many of the benefits of the N-way Doherty amplifier with respect to power efficiency.

According to some embodiments of the present disclosure, a package incorporating an internal connection and/or combination between the outputs of multiple transistors of the device package may provide a number of advantages over the current devices, while allowing for less complex output matching circuitry that may utilize less space. For example, embodiments of the present disclosure may enable an N-way Doherty amplifier to be implemented using the output-matching circuit of a 2-way (asymmetric) Doherty amplifier. The internal combination may be provided by a combined output lead formed as part of the package that provides a combined output signal from the device package.

Some embodiments of the present disclosure may provide a Doherty combination node that exists on an "edge plane combination node" (which may also be referred to herein simply as an "edge plane" or "edge"). As used herein, an edge plane combination node refers to a physical combination structure, such as a combined output lead, in which the electrical signals to be combined (e.g., the output signal of multiple amplifier dies) are electrically connected along a physical plane that laterally extends in a first direction such that the combination structure is configured to combine and/or mix the flow of electrical signals along the plane. The signal coming from the transistor die may flow perpendicularly into the edge plane, and a majority and/or all points on the edge plane have same or similar phase difference with respect to the output lead. As used herein, the edge plane is not required to be uniform in material and may be composed of different types of materials electrically connected together. For example, portions of the edge plane may include multiple types of conductive structures including conductive traces, conductive/metal leads and/or bond wires. By implementing the Doherty combination on an edge plane instead of by a point node (e.g., at an intersection of wires/traces), embodiments of the present disclosure can be easily scaled up to larger peripheries for more power.

In embodiments according to the present disclosure, since the combined signal (e.g., from the internally combined peaking amplifier dies) can be provided/connected to a combined output lead, a wide (and low impedance) PCB matching circuit can be used and/or connected to the combined output lead. There may be no need for separate matching leads that are smaller and/or skinnier so as to connect to individual ones of the output leads. Also, the ability to connect the matching circuit to the combined output lead may allow a single DC feed (e.g., for biasing) to be applied to all of the combined amplifiers (e.g., all of the combined peaking amplifier dies) and/or the output matching network. Typically, it is challenging to fit a separate DC feed for each peaking amplifier die in N-way Doherty amplifiers.

In some embodiments of the present disclosure, the Doherty combination of the peaking amplifier dies may use load-modulation from a complex-to-complex load. Some related Doherty amplifiers may modulate from a real-to-real load. The complex-to-complex load modulation utilized by embodiments of the present disclosure may provide greater flexibility to the types of pre-matching circuitry that may be used in the integrated Doherty amplifier.

By operating on a principle of Doherty modulation from complex-to-complex load, parasitic inductance from the transistor die to the Doherty combination element that combines the output signals may not degrade the performance of the Doherty amplifier. Parasitic inductance from the wire-bonds connecting the transistor die to the combination node element and/or the PCBs may be difficult to avoid, but may be used as part of the Doherty combination method of the present disclosure.

Figure 3:
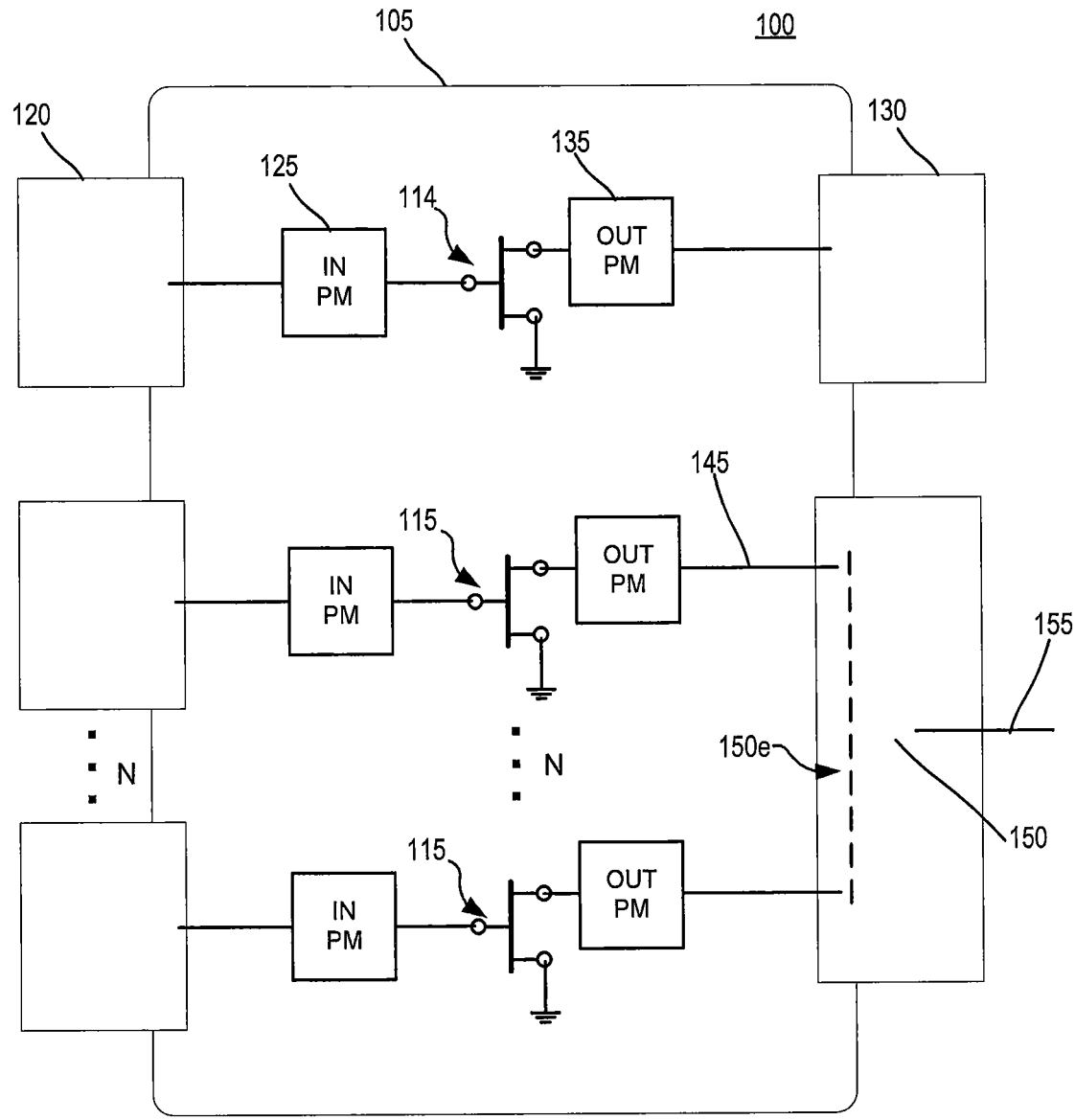
FIG. 3 is a schematic diagram of an amplifier package according to some embodiments of the present disclosure.

FIG. 3 is a schematic diagram of an amplifier package 100 according to some embodiments of the present disclosure.

Referring to FIG. 3, an amplifier package 100 according to some embodiments of the present disclosure may include a plurality of transistor amplifier dies such as one or more first transistor amplifier dies 114 and one or more second transistor amplifier dies 115. In FIG. 3, one first transistor amplifier die 114 and N second transistor amplifier dies 115 are illustrated, but the present disclosure is not limited thereto. In some embodiments, the amplifier package 100 may be a Doherty amplifier, and the one or more first transistor amplifier dies 114 may be main amplifiers and the one or more second transistor amplifier dies 115 may be peaking amplifiers. In such embodiments, the one or more first transistor amplifier dies 114 may be biased differently than the one or more second transistor amplifier dies 115. In some embodiments, the one or more second transistor amplifier dies 115 may each have a same size of transistor amplifier die. In some embodiments, the one or more first transistor amplifier dies 114 may have a different die size than the one or more second transistor amplifier dies 115.

The one or more first transistor amplifier dies 114 and the one or more second transistor amplifier dies 115 may be disposed on a submount 105 of the amplifier package 100. In some embodiments, the submount 105 may include materials configured to assist with the thermal management of the amplifier package 100. For example, the submount 105 may include copper and/or molybdenum. In some embodiments, the submount 105 may be composed of multiple layers and/or contain vias/interconnects. In an example embodiment, the submount 105 may be a multi-layer copper/molybdenum/copper metal flange that comprises a core molybdenum layer with copper cladding layers on either major surface thereof. In some embodiments, the submount 105 may include a metal heat sink that is part of a lead frame or metal slug.

Though not expressly illustrated in FIG. 3, the amplifier package 100 may include sidewalls to form an open cavity into which the first and second transistor amplifier dies 114, 115 are placed and/or the amplifier package 100 may include a plastic overmold that at least partially surrounds the first and second transistor amplifier dies 114, 115.

The amplifier package 100 may include input leads 120, one or more individual output leads 130, and one or more combined output leads 150. Respective ones of the input leads 120 may be coupled to a control terminal (e.g., a gate) of the first transistor amplifier dies 114 or the second transistor amplifier dies 115. In some embodiments, an input prematch circuit 125 may be coupled between respective ones of the input leads 120 and respective ones of the first or second transistor amplifier dies 114, 115. The input prematch circuit 125 may be configured to perform input impedance matching and/or harmonic termination, as well as other input signal conditioning functions. In some of the embodiments, the input prematch circuits 125 may be identical or may be different from one another. That is to say that a first input prematch circuit 125 coupled to the first transistor amplifier die 114 may be different from a second input prematch circuit 125 coupled to one of the second transistor amplifier dies 115. Similarly, input prematch circuits 125 coupled to different ones of the second transistor amplifier dies 115 may be different from one another.

An output terminal (e.g., a drain) of the first transistor amplifier die 114 may be coupled to one of the output leads 130. In some embodiments, an output prematch circuit 135 may be coupled between the first transistor amplifier die 114 and the output lead 130.

Output terminals (e.g., a drain) of one or more of the second transistor amplifier dies 115 may be coupled to the one or more combined output leads 150. An output prematch circuit 135 may also be coupled between respective ones of output terminals of the second transistor amplifier dies 115 and the combined output lead 150. The output prematch circuit 135 may be configured to perform output impedance matching and/or harmonic termination, as well as other output signal conditioning functions.

In some of the embodiments, the output prematch circuits 135 may be identical or may be different from one another. That is to say that a first output prematch circuit 135 coupled to the first transistor amplifier die 114 may be different from a second output prematch circuit 135 coupled to one of the second transistor amplifier dies 115. Similarly, output prematch circuits 135 coupled to different ones of the second transistor amplifier dies 115 may be different from one another.

Output signals 145 that are transmitted from the output terminals of the second transistor amplifier dies 115 may be internally (e.g., internal to the amplifier package 100) combined by the combined output lead 150. The combined output lead 150 may be configured to combine the output signals 145 of the second transistor amplifier dies 115 to generate a combined output signal 155. The combined output signal 155 may be output by the combined output lead 150 of the amplifier package 100. Though the amplifier package 100 is illustrated as having a single combined output lead 150, the embodiments of the present disclosure are not limited thereto. In some embodiments, more than one combined output lead 150, respectively coupled to various subsets of the first and second transistor amplifier dies 114, 115 may be provided.

In some embodiments, the combined output lead 150 may allow for a Doherty combination of the output signals of the second transistor amplifier dies 115. Some Doherty amplifier configurations incorporate combining circuitry that performs impedance modulation that is targeted to go from a real to real impedance. That is to say that the combining circuitry performs impedance transformation and phase rotation to provide a load impedance as seen from the peak and/or main amplifier that comprises primarily real (e.g., resistive) components. Such combining circuitry may be represented schematically, for example, by a first output combiner 18_1 and/or a second output combiner 18_2 of FIG. 2. The configuration required to meet the real-to-real post impedance matching network may, however, result in limitations on the bandwidth of the device and increase the complexity of configuration of the device. In particular, additional phasing lines added in order to get the load modulation trajectory back to real impedances may significantly reduce the bandwidth. However, as appreciated by the inventors, Doherty combination circuitry may still combine the signals adequately even if the load impedance includes complex components. That is, a satisfactory Doherty combination may be achieved with a complex-to-complex load modulation.

Figure 9A:
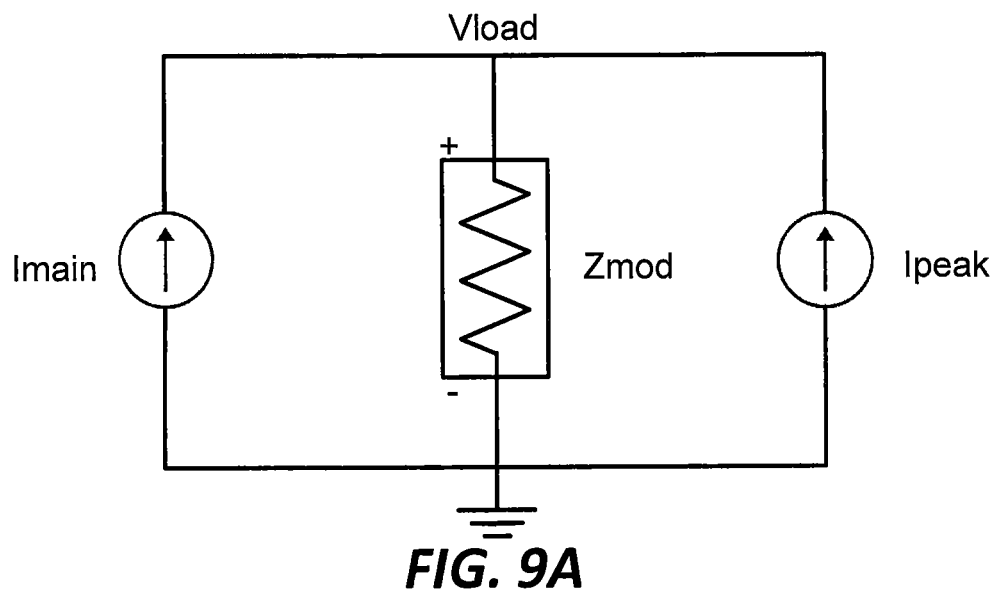
FIGS. 9A and 9B are a circuit diagram and Smith chart, respectively, illustrating theories of operation for load modulation from a complex-to-complex load.

As one theory of operation, it is believed that conditions of the load modulation of the Doherty amplifier may be configured so that complex-to-complex modulation may be performed in a way that provides good Doherty performance while providing additional advantages of simplicity and compact implementation. An explanation of this operations will be provided with reference to FIGS. 9A and 9B.

During operation of a Doherty amplifier incorporating a main and a peak amplifier, such as the main and peak amplifiers 14, 15 of FIG. 1, the load impedance seen from the main amplifier is modulated from a starting impedance Z1m to an ending impedance Z2m. Likewise, the load impedance seen from the peak amplifier is modulated from Z1p to Z2p. Analysis of the load modulation is discussed, for example, in Cripps, S. C., Advanced Techniques in RF Power Amplifier Design, Norwood, MA: Artech House, 2002. The trajectory of this load modulation can be analyzed with the simplified circuit shown in FIG. 9A in which the main and peak amplifiers are represented by the current sources Imain and Ipeak, both of which drive current into a summing node impedance Zmod. The impedances seen from the main and peak amplifiers, Zmain and Zpeak can be expressed as:

$$Z_{main} = Z_{mod}\left(\frac{I_{main} + I_{peak}}{I_{main}}\right) \quad (1)$$

$$Z_{peak} = Z_{mod}\left(\frac{I_{main} + I_{peak}}{I_{peak}}\right) \quad (2)$$

where Imain and Ipeak are given as $$I_{main} = I_m e^{i\varnothing_m}, I_{peak} = I_p e^{i\varnothing_p} \quad (3)$$

Imain and Ipeak are complex current source representing the main and peak transistor dies respectively. For a simplified analysis, Imain is normalized so Im=1, and $\varnothing_m$=0, and remains constant during load modulation. $\varnothing_p$ is also held constant during load modulation while Ip is varied from 0 to the power ratio of peak to main amplifier, $R_{VSWR}$. The load trajectory for Zmain and Zpeak is then given by:

$$Z_{main} = Z_{mod}(1 + I_p e^{i\varnothing_p}) \quad (4)$$

$$Z_{peak} = Z_{mod}\left(1 + \frac{1}{I_p e^{i\varnothing_p}}\right) \quad (5)$$

$$\{I_p = 0, \text{ to } R_{VSWR}\}$$

Figure 9B:
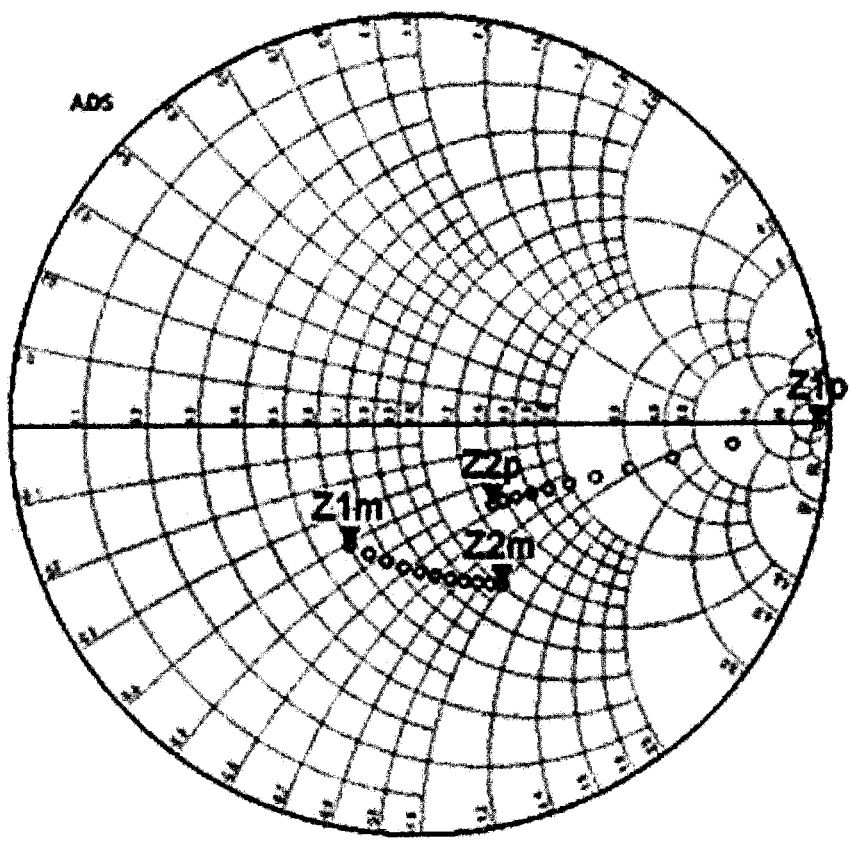

For any given value of $\varnothing_p$, $R_{VSWR}$ and complex impedance Zmod, a pair of modulation trajectories exists for Zmain and Zpeak (e.g., from Z1m to Z2m and from Z1p to Z2p). FIG. 9B is an example Smith chart illustrating the modulation trajectory for the case where $\varnothing_p$=−21 degrees, $R_{VSWR}$=1, and Zmod=3−2j Ohms. This modulation trajectory is plotted on a Smith chart normalized to 5 ohms.

The integrated output Doherty combining may work on the principle that the arrangement of wire bonds and capacitors in the output prematch circuit are selected so that:

Z mod=Z1m;

Zopt_main=Z2m;

Zoff_peak*=Z1p; and

Zopt_peak=Z2p, where Zmod and Zopt_main corresponds to the optimum impedance of the main power amplifier at backed-off power levels and full power level respectively, Zopt_peak corresponds to the optimum impedance of the peak power amplifier, and Zoff_peak corresponds to the peaking off-state impedance.

In addition, integrated output Doherty combining may work when the Zmod and $Ø_p$ are selected such that real$(Z1p)$>>real(Zmod). In some embodiments, the configuration may be selected such that real$(Z1p)$>=20×real(Zmod).

As can be seen from the above discussion, an integrated output Doherty combination may be satisfactorily performed even when all four impedances are complex impedances, i.e., having an imaginary component. Though the above discussion has been provided with respect to load modulation for main and peak amplifiers, the same theory of operation is believed to work for Doherty combinations of a plurality of peaking amplifiers. Thus, according to some embodiments of the present disclosure, an effective Doherty combination may be achieved within the amplifier package 100 using a combined output lead 150.

In some embodiments, the combined output lead 150 may include an edge (or edge plane) 150e that allows for the electrical combination of the output signals 145 of the second transistor amplifier dies 115 along a longitudinal dimension of the combined output lead 150 (or at least a major dimension of the combined output lead). The edge 150e of the combined output lead 150 may provide increased flexibility to the amplifier package 100.

In some conventional configurations, combination circuitry is provided in a "node" configuration. Stated another way, the output signal of the transistor amplifier dies that are to be combined are coupled to a transmission line or node on the transistor bond pad or other internal package element having a relatively small connection area. As a result, if a size of the transistor die coupled to the combination circuitry is increased, the combination circuitry must be moved or otherwise reconfigured, making adjustments to the device difficult.

According to some embodiments of the present disclosure, providing a combined output lead 150 with an extending lateral edge 150e allows for the connection areas of the device to automatically scale with the size of the transistor amplifier dies being used. The edge 150e provides a relatively large and/or wide connection surface that can adjust to different sizes of the second transistor amplifier dies 115, allowing the amplifier package 100 to be more flexible, while still providing a sufficient connection plane to provide an appropriate Doherty combination signal. The edge 150e is shown herein as a dashed line to indicate a general configuration and location of the combining edge of the signals. However, the illustrated dashed line is not intended to limit the embodiments of the present disclosure.

FIGS. 4A to 4D are schematic diagrams illustrating configurations of the amplifier package 100 that incorporate input and output matching networks, according to some embodiments of the present disclosure. FIGS. 4A to 4D illustrate, in part, some of the benefits that accrue from the use of the amplifier package 100 incorporating the combined output lead 150. In FIGS. 4A to 4D, an example of a three-way Doherty amplifier is illustrated, but it will be understood that this is merely an example, and that an N-way Doherty amplifier or an amplifier other than a Doherty amplifier could be used as well without deviating from the present disclosure. In FIGS. 4A to 4D the input and output prematch circuits shown in FIG. 3 are omitted for brevity, but may be present in some embodiments without deviating from the scope of the present disclosure.

Figure 2:
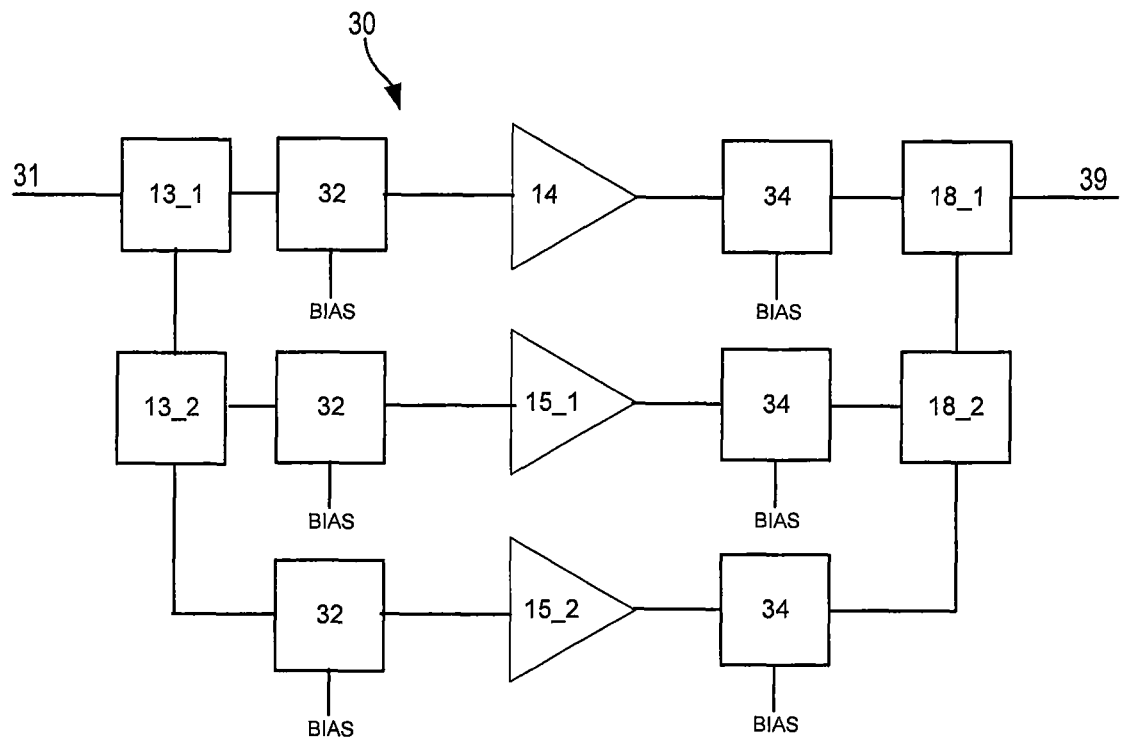
FIG. 2 is a schematic diagram of a three-way Doherty amplifier.
Figure 4A:
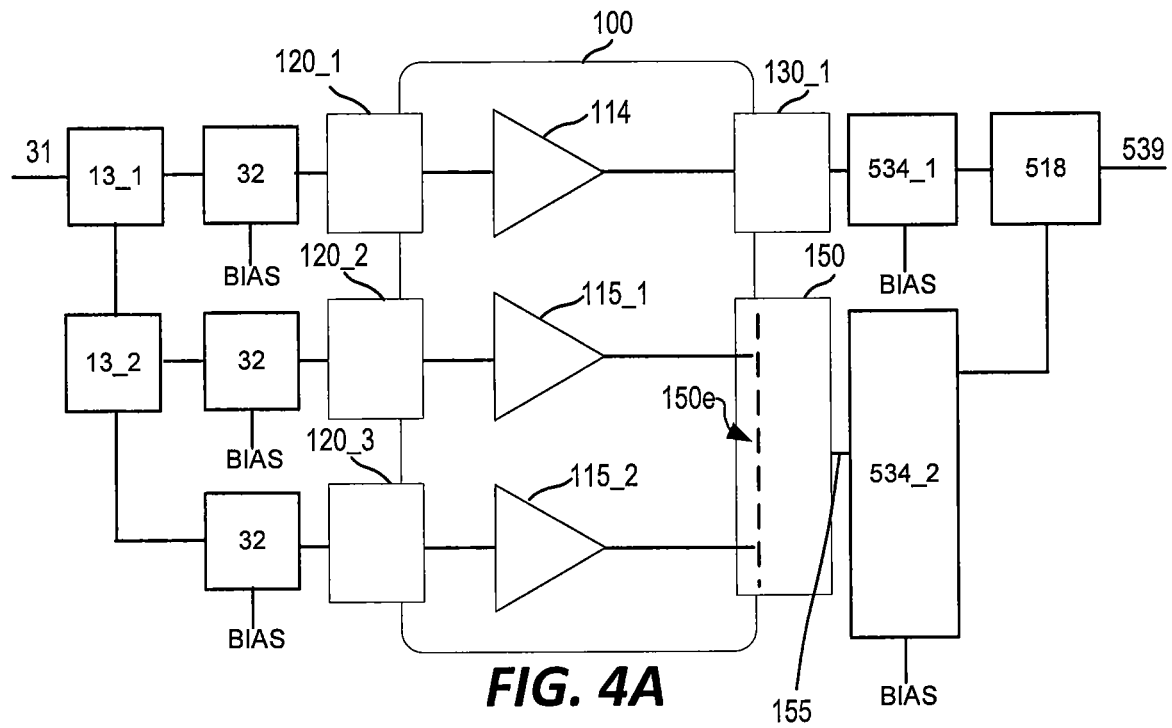
FIGS. 4A to 4D are schematic diagrams illustrating configurations of an amplifier package that incorporate input and output matching networks, according to some embodiments of the present disclosure.

Referring to FIG. 4A, the amplifier package 100 may be coupled to a plurality of input splitters and an input matching network in a manner similar to that described herein with respect to FIG. 2. For example, the RF input 31 may be coupled to the first input splitter 13_1. A first output of the first input splitter 13_1 may be coupled to a first input lead 120_1 of the amplifier package 100 through an input match circuit 32 and a second output of the first input splitter 13_1 may be coupled to the second input splitter 13_2. The first input lead 120_1 may be coupled to the first transistor amplifier die (e.g., the main amplifier die) 114 internal to the amplifier package 100.

The outputs of first input splitter 13_1 may be separated in phase (e.g., by 90 degrees). The outputs of the second input splitter 13_2 may be coupled to a second input lead 120_2 and a third input lead 120_3 through input match circuits 32, respectively. The inputs to the second and third input leads 120_2, 120_3 may also be arranged to be out of phase with one another (e.g., by 90 degrees) by the second input splitter 13_2. The second input lead 120_2 and the third input lead 120_3 may be respectively coupled to a first of the second transistor amplifier dies (e.g., a first peaking amplifier die) 115_1 and a second of the second transistor amplifier dies (e.g., a second peaking amplifier die) 115_2 internal to the amplifier package 100.

As illustrated in FIG. 4A, the input network to the amplifier package 100 may be configured in a similar way to the 3-way Doherty amplifier of FIG. 2 with the exception that the transistors of the Doherty amplifier are included in a common amplifier package 100.

However, the output network of the amplifier package 100 differs from that of FIG. 2. As illustrated in FIG. 4A, the amplifier package 100 provides an integrated package providing a first output lead 130_1 and a combined output lead 150. The first output lead 130_1 may be coupled to an output of the first transistor amplifier die 114. The combined output lead 150 may be coupled to two or more outputs of the second transistor amplifier dies 115_1, 115_2. As discussed herein with respect to FIG. 3, the combined output lead 150 may provide a combined signal 155 that combines the output signals of the second transistor amplifier dies 115_1, 115_2. As a result, the output lead 130_1 and the combined output lead 150 can be treated as an output of a 2-way Doherty amplifier. Stated another way, the configuration illustrated in FIG. 4A need only perform one combination between the output of the main transistor amplifier die 114 and the internally-combined signal 155 of the peaking transistor amplifier dies 115_1, 115_2.

For example, the output signal from the first output lead 130_1 may be coupled to an output combiner 518 through a first output match circuit 534_1. The output signal from the combined output lead 150 may be coupled to the output combiner 518 through a second output match circuit 534_2. The output of the output combiner 518 may be provided as the RF output 539. The output combiner 518 may perform load modulation and/or phase matching between the output signal from the first output lead 130_1 and the output signal from the combined output lead 150.

This configuration provides a number of advantages over the configuration of, for example, FIG. 2. As can be seen in FIG. 4A, the output network is much simpler. Rather than multiple output combiners, a single output combiner 518 may be used, simplifying the configuration. As the output combiner 518 may include components that can limit bandwidth, the configuration of FIG. 4A may provide the power efficiency of a 3-way Doherty amplifier while providing the simpler output configuration of a 2-way Doherty amplifier.

In addition, the configuration of FIG. 4A incorporates fewer output match circuits 534_1, 534_2. This provides at least two benefits. First, by reducing the number of output match circuits, more space is provided for the circuits themselves. This allows the size of the output match circuit to increase compared to conventional devices, allowing for additional configuration capacity. Moreover, each of the output match circuits may utilize biasing (shown by BIAS signals) which may require additional wiring connectivity and routing. As can be seen in a comparison of FIG. 4A to FIG. 2, the use of fewer output match circuits 534_1, 534_2 allows the number of bias circuits that are needed to be reduced as well, which allows for more flexibility in configuring and placing the amplifier package 100.

In FIG. 4A, the second output match circuit 534_2 is illustrated as being coupled to the combined output lead 150. In some embodiments, this connection may be made by bond wires. In some embodiments, the second output match circuit 534_2 may be configured partially as a PCB inside the package, and partially with PCB transmission lines external to the package.

Though the embodiments of FIGS. 3 and 4A illustrate embodiments where the combined output lead 150 is provided as an extended, larger output lead (e.g., as compared to output lead 130, it will be understood that the embodiments of the present disclosure are not limited thereto. In some embodiments, the combined output lead 150 may incorporate an internal portion 1501 that is internal to the amplifier package as well as one or more protrusions 150P that extend outside the package. The protrusions 150P may be sized similarly to output lead 130, though the embodiments of the present disclosure are not limited thereto.

Figure 4B:
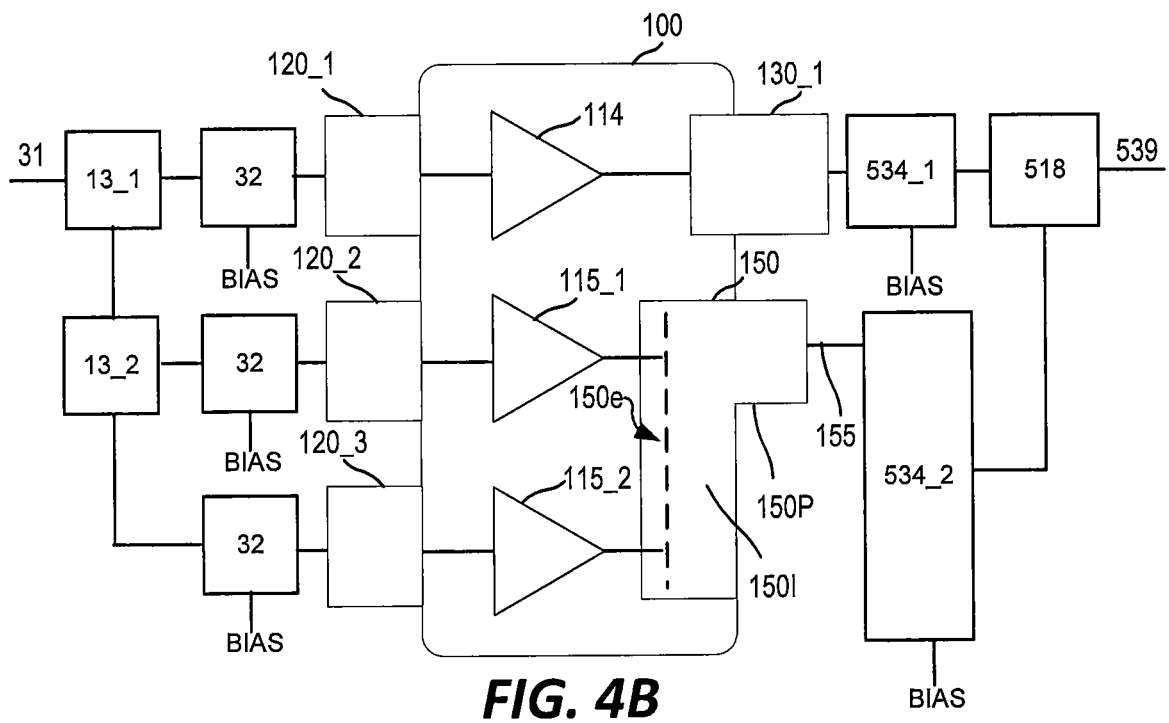

FIG. 4B illustrates an embodiment in which the combined signal 155 from the combined output lead 150 is provided to a protrusion 150P extending from the internal portion 1501 of the combined output lead 150. The internal portion 1501 may have a longitudinal axis extending in parallel to a side of the amplifier package 100. The internal portion 1501 may include the lateral edge 150e which provides a longitudinally extending surface to which the output signals from the second transistor amplifier dies 115_1, 115_2 may be connected. In some embodiments, the internal portion 1501 may be partially or wholly within the amplifier package 100. The protrusion 150P of the combined output lead 150 may extend from the internal portion 1501. In some embodiments, the protrusion 150P may extend from the amplifier package 100 to have at least a portion that is external to the amplifier package 100. The protrusion 150P may, in some embodiments, be sized similarly to the output lead 130. The output match circuit 534_2 may be coupled to the protrusion 150P of the combined output lead 150.

Figure 4C:
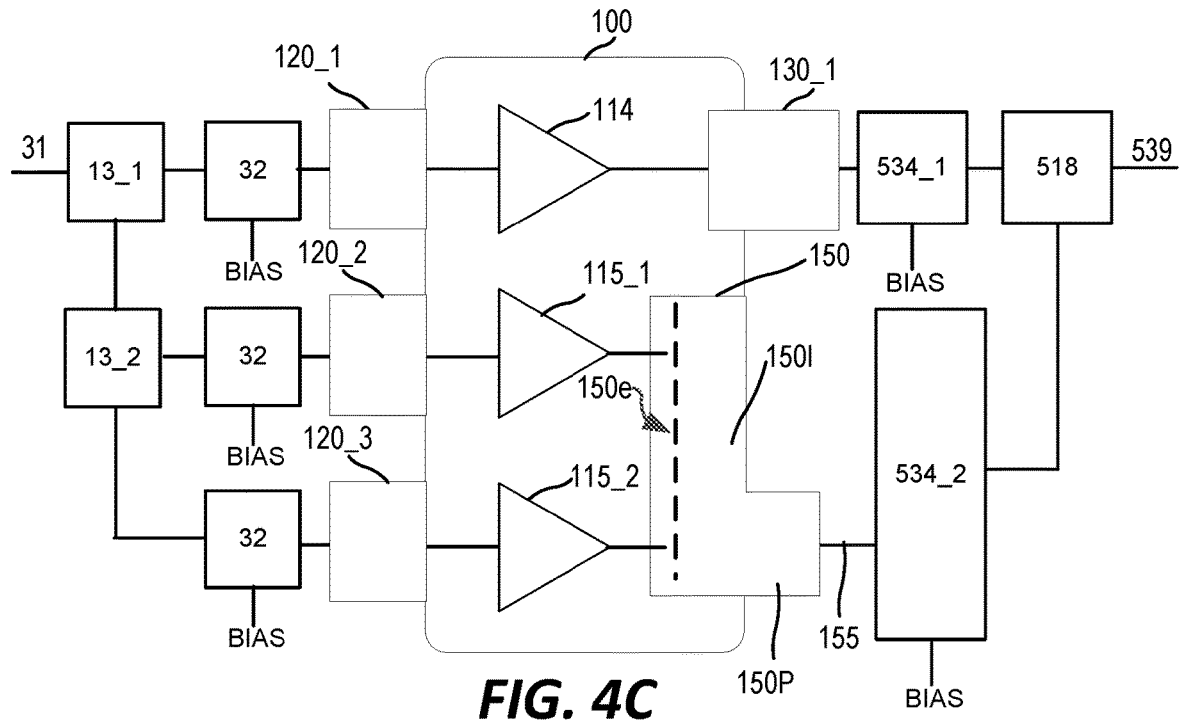

FIG. 4C illustrates an embodiment in which the protrusion 150P of the combined output lead 150 extends from a location on the internal portion 1501 that is opposite the combined output lead 150 from the output lead 130_1. FIG. 4C illustrates that the protrusion 150P may extend from anywhere along the combined output lead 150.

Figure 4D:
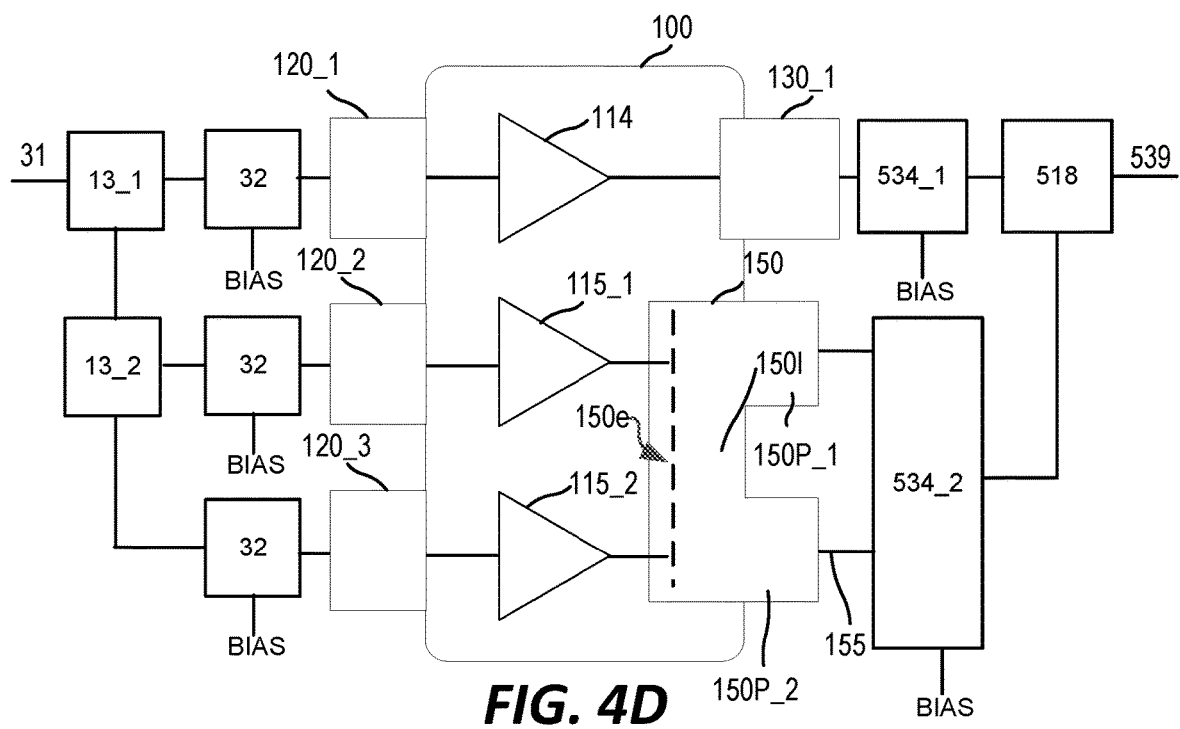

FIG. 4D illustrates an embodiment in which a plurality of protrusions 150P_1, 150P_2 extend from the internal portion 1501 of the combined output lead 150. Thus, the plurality of protrusions 150P_1, 150P_2 may provide multiple connection points where the combined output signal 155 may be output from the amplifier package 100. The output match circuit 534_2 may be coupled to only one of the protrusions (e.g., a first protrusion 150P_1 or a second protrusion 150P_2) or both of the protrusions 150_1, 150_2 to receive the combined output signal 155.

It will be understood that the use of two second transistor amplifier dies 115 (e.g., peaking amplifier dies) and one first transistor amplifier die 114 (e.g., main amplifier die) is only for convenience of description and that other combinations could be used. For example, in some embodiments, N peaking amplifier dies 115 may be combined and one or more combined output leads 150 may be configured to provide a combined signal 155 to an output match circuit. In some embodiments, the first transistor amplifier die 114 may be a plurality of first transistor amplifier dies 114. In some embodiments, the plurality of first amplifier dies 114 may also be internally combined/connected within the amplifier package 100 using a combined output lead 150. In addition, the use of a single combined output lead 150 is only an example and not intended to limit the embodiments of the present disclosure. In some embodiments, multiple combined output leads 150 may be used. For example, in some embodiments, N peaking amplifier dies 115 may be present and a first combined output lead 150 may be used to combine the output of a first subset of the N peaking amplifier dies 115 (e.g., N/2 peaking amplifier dies) and a second combined output lead 150 may be used to combine the output of a second subset of the N peaking amplifier dies 115 (e.g., N/2 peaking amplifier dies). Other combinations in keeping with the present disclosure will be understood by those of ordinary skill in the art.

Figure 5A:
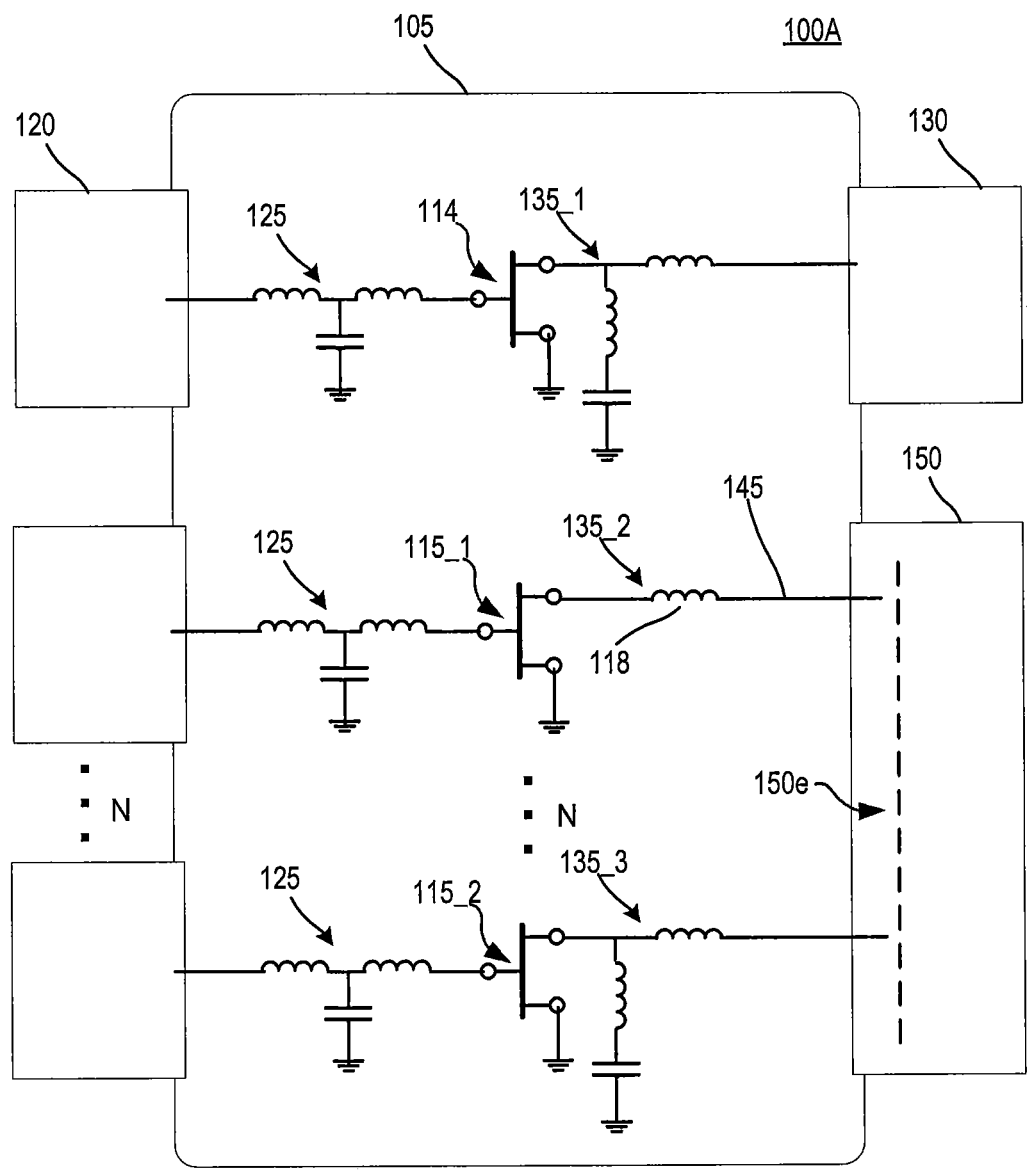
FIGS. 5A to 5C are schematic diagrams illustrating example configurations of an input and output prematch circuits, according to some embodiments of the present disclosure.
Figure 5B:
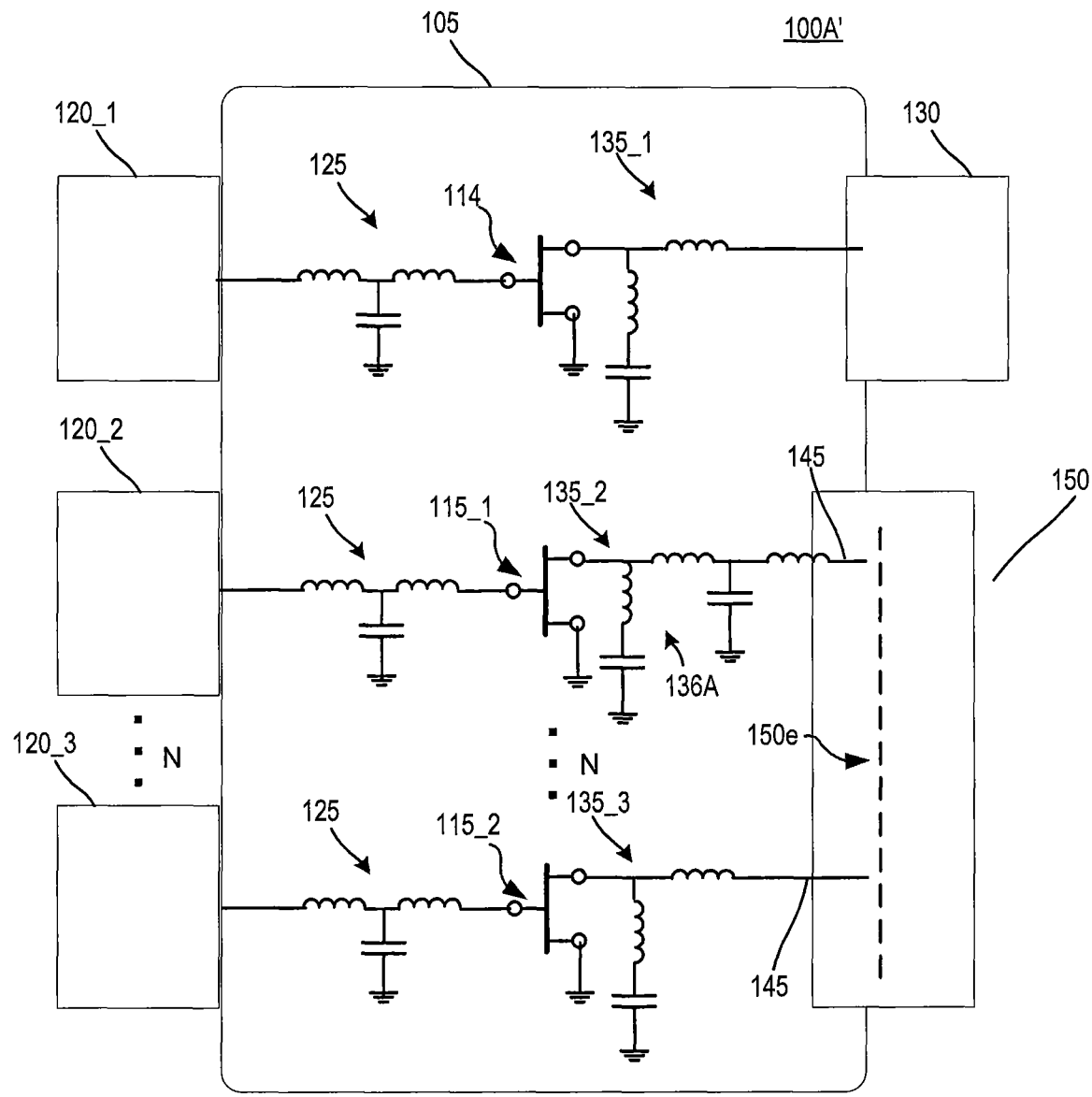
Figure 5C:
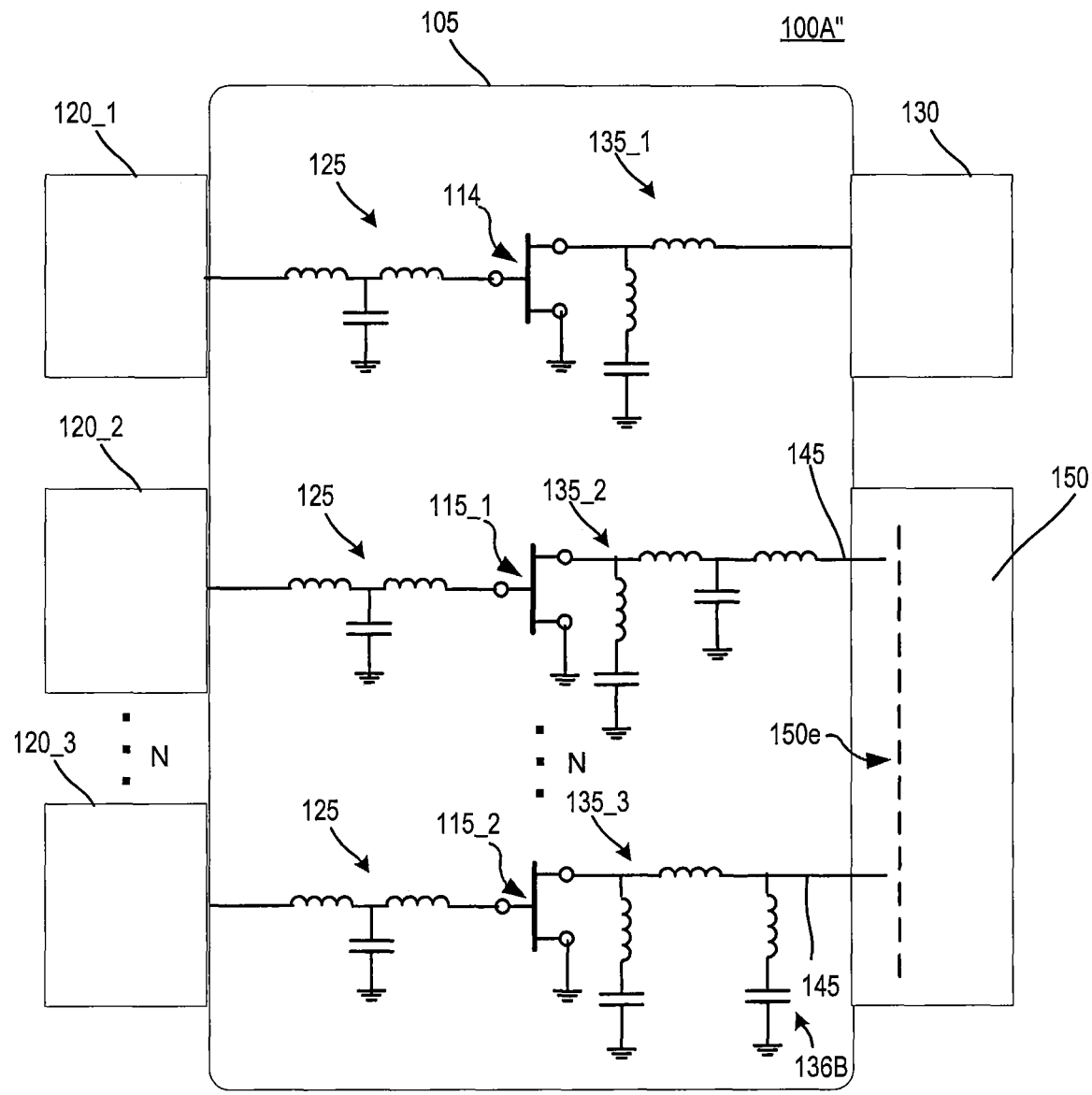

The input prematch circuits 125 and output prematch circuits 135 of FIG. 3 can be configured in various ways. FIGS. 5A to 5C are schematic diagrams illustrating example configurations of an input and output prematch circuits 125, 135 of the first and second transistor amplifier dies 114, 115, according to some embodiments of the present disclosure. A description of elements of FIGS. 5A to 5C that have been previously described will be omitted for brevity. In FIGS. 5A to 5C, different instantiations of a particular element (e.g., a first output prematch circuit 135_1 of the output prematch circuits 135) may be given a different reference designator to assist in the description. This is merely for ease of discussion and is not intended to limit the scope of the present disclosure. Similarly, as with the previous discussion, the amplifier package 100 is illustrated with three first and second transistor amplifier dies. This is intended to only be an example and is not intended to limit the interpretation of the disclosure.

Referring to FIG. 5A, an amplifier package 100A may include an input prematch circuit 125 for each first and second transistor amplifier die 114, 115. The prematch circuit 125 may use an L-C-L (low-pass) prematch, where L refers to an inductance element and C refers to a capacitance element. The input prematch circuit 125 is merely an example, and other configurations could be used without deviation from the embodiments described herein. For example, the input prematch circuit 125 could be designed with any other suitable prematch (e.g., including input harmonic termination, etc.). Similarly, the input prematch circuit 125 coupled to respective ones of the first and second transistor amplifiers dies 114, 115 may differ from one another.

The first transistor amplifier die 114 (e.g., the main amplifier) of amplifier package 100A may be coupled to a first output prematch circuit 135_1 incorporating a high-pass output prematch (a shunt L-C, and a series L). This is merely an example, and the first output prematch circuit 135_1 can be coupled to an output prematch circuit 135 with any appropriate pre-matching configuration (high-pass, un-matched, low-pass etc.).

A first of the second transistor amplifier dies 115_1 (e.g., a first peaking amplifier die) may be coupled to the combined output lead 150 by a second output prematch circuit 135_2 incorporating a series inductance (L) 118. In some embodiments, the series inductance 118 may be configured to shift a phase of the output signal of the first of the second transistor amplifier dies 115_1. For example, when the second transistor amplifier die 115_1 is a first peaking amplifier die, the input to the first peaking amplifier die may be out-of-phase (e.g., by 90 degrees) with the input of the second of the second transistor amplifier dies 115_2, which may be a second peaking amplifier die. The series inductance 118 may be configured to shift the phase of the output signal of the first peaking amplifier die 115_1 to be closer to the output signal of the second peaking amplifier die 115_2. In some embodiments the phases of the output signals of the first and second peaking amplifier dies 115_1, 115_2 need not exactly match to be combined by the combined output lead 150.

The second of the second transistor amplifier dies 115_2 (e.g., a second peaking amplifier die) may be coupled to the combined output lead 150 by a third output prematch circuit 135_3 incorporating a high-pass output prematch (a shunt L-C, and a series L). The inductance elements may, in some embodiments, be provided by bond wires. The capacitance elements may, in some embodiments, be provided by metal-oxide-semiconductor (MOS) and/or surface mount technology (SMT) capacitors.

FIG. 5B is a schematic diagram of an additional amplifier package 100A' that illustrates variations that may be made to the output prematch circuits 135. In the amplifier package 100A of FIG. 5A, the first of the second transistor amplifier dies 115_1 (e.g., the first peaking amplifier die) has a simple inductor L (e.g., made from a plurality of paralleled bond wires) connecting the output of the first peaking amplifier die 115_1 to the combined output lead 150. In the amplifier package 100A' of FIG. 5B, the first peaking amplifier die 115_1 is connected to the combined output lead 150 by an output prematch circuit 135_2 that includes a five-element network made up of two capacitors and three inductors. One or more of the capacitors may be an integrated passive device (IPD) with additional R-L-C elements 136A to improve the low frequency response of the amplifier package 100A'. The values of inductance and capacitance in the output prematch circuits 135_2, 135_3 of both second transistor amplifier dies 115_1, 115_2 may be selected so as to maintain good Doherty behavior, by keeping in compliance with the equations described herein with respect to FIGS. 9A and 9B. The amplifier package 100A' has the advantage of raising the impedance to higher resistive values for easier matching with an external output match circuit (see, e.g., output match circuit 534_2 of FIGS. 4A to 4D).

FIG. 5C is a schematic diagram of an additional amplifier package 100A" that illustrates additional variations that may be made to the output prematch circuits 135. The embodiment is similar to that of FIG. 5B, but the amplifier package 100A" includes an additional L-C network 136B as part of the output prematch circuit 135_3 coupled to one of the second transistor amplifier dies 115_2 (e.g., the second peaking amplifier die). This may enable an impedance of one of the second transistor amplifier dies 115_2 to be raised to higher impedance levels for better compatibility with the impedances of another one of the second transistor amplifier dies 115_2 (e.g., 115_1) when useful.

The equivalent circuits illustrated in FIGS. 5A to 5C may be physically implemented in a number of package configurations. FIGS. 6A to 6E are schematic diagrams of component layouts of example packages according to embodiments of the present disclosure. A description of elements of FIGS. 6A to 6E that have been previously described will be omitted for brevity. For ease of description, FIGS. 6A to 6E omit an explicit illustration of some elements of the package, such as biasing circuits. FIGS. 6A to 6E focus on the schematic diagram illustrated in FIG. 5A, but it will be understood that other circuit configurations, such as those of FIGS. 5B and 5C, as well as others, may be implemented similarly without deviating from the scope of the present disclosure.

Figure 6A:
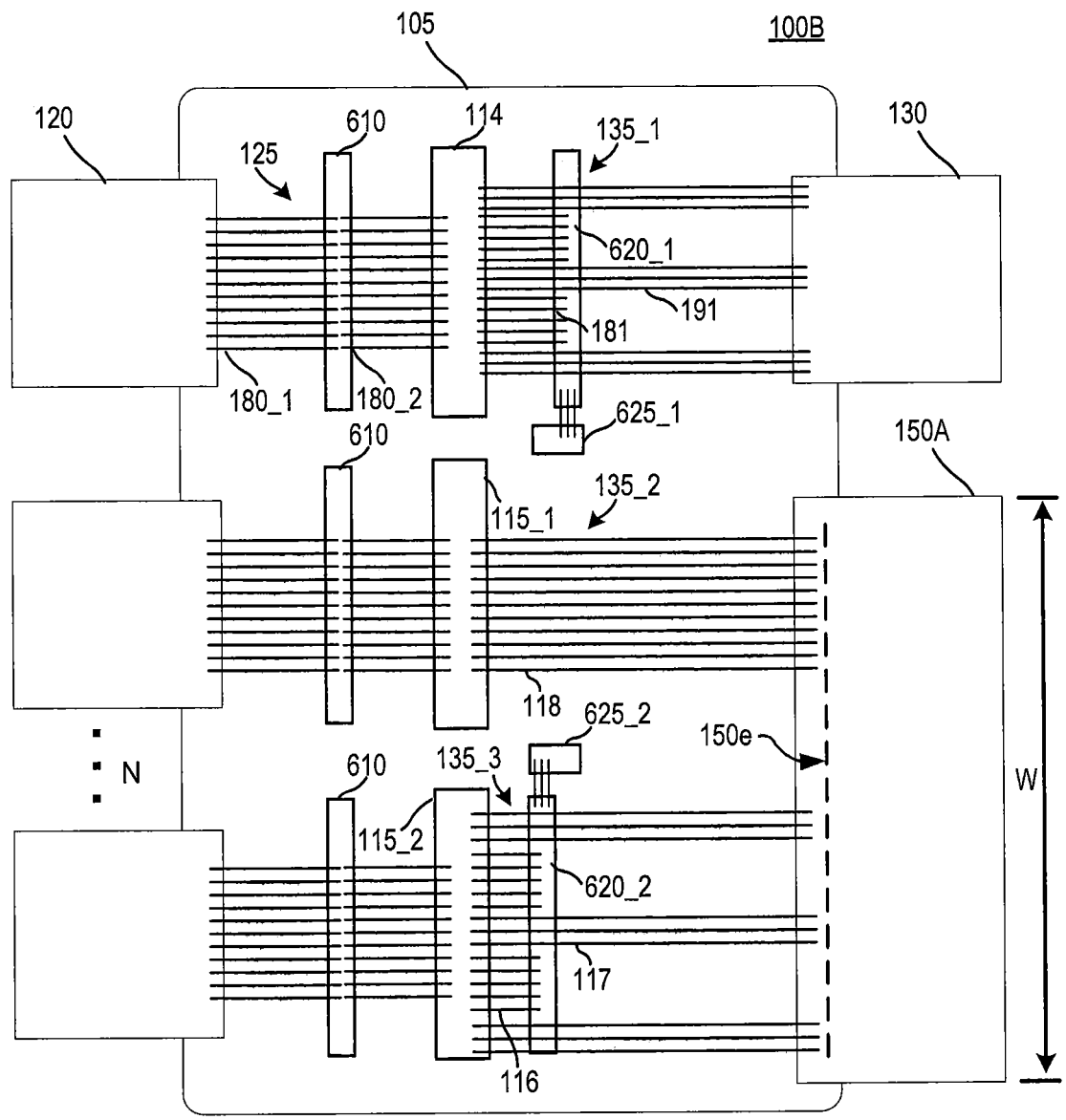
FIGS. 6A to 6E are schematic diagrams of component layouts of example packages according to embodiments of the present disclosure.

Referring to FIG. 6A, an amplifier package 100B may include a submount 105, input leads 120, an output lead 130, and a combined output lead 150A. One or more first transistor amplifier dies 114 and a plurality of second transistor amplifier dies 115 (illustrated as second transistor amplifier dies 115_1 and 115_2) may be mounted on the submount 105. Respective ones of the first and second transistor amplifier dies 114, 115_1, 115_2 may be coupled to respective ones of the input leads 120 through respective input prematch circuits 125. The input prematch circuits 125 may be, in some embodiments, LC-L circuits similar to that illustrated in FIG. 5A. The L-C-L input prematch circuits 125 may be implemented, for example, by first bond wires 180_1 coupled between an input lead 120 and a capacitor 610 and second bond wires 180_2 coupled between the capacitor 610 and the corresponding one of the first and second transistor amplifier dies 114, 115_1, and 115_2. The bottom side of the capacitor 610 may be coupled to a ground plane of the amplifier package 100B. In some embodiments, the capacitor 610 may be a MOS capacitor.

The first transistor amplifier die 114 may be coupled to output lead 130, and second transistor amplifier dies 115_1, 115_2 may be coupled to the combined output lead 150A, via respective output prematch circuits 135 (illustrated as a first output prematch circuit 135_1, a second output prematch circuit 135_2, and a third output prematch circuit 135_3). For example, the first transistor amplifier die 114 may be coupled to an output lead 130 through the first output prematch circuit 135_1. The first output prematch circuit 135_1 may be a high-pass output prematch (a shunt L-C, and a series L). For example, the shunt L-C of the first output prematch circuit 135_1 may be implemented by first bond wires 181 coupled between the first transistor amplifier die 114 and a capacitor 620_1. The bottom side of capacitor 620_1 may be coupled to a ground plane of the amplifier package 100B. In addition, the capacitor 620_1 may, in some embodiments, be coupled to a base-band decoupling capacitor 625_1 to present an optimized low impedance termination to the transistor amplifier die 114 at low frequencies (e.g., below 500 MHz). In some embodiments, the base-band decoupling capacitor 625_1 may be optional and omitted. The series L of the first output prematch circuit 135_1 may be implemented by second bond wires 191 coupled between the first transistor amplifier die 114 and the output lead 130.

The first of the second transistor amplifier dies 115_1 (e.g., a first peaking amplifier die 115_1) may be coupled to the combined output lead 150A through a second output prematch circuit 135_2. The second output prematch circuit 135_2 may be a series L. The series L of the second output prematch circuit 135_2 may be implemented by bond wires 118 coupled between the first of the second transistor amplifier die 115_1 and the combined output lead 150A.

The second of the second transistor amplifier dies 115_2 (e.g., a second peaking amplifier die 115_2) may be coupled to the combined output lead 150A through a third output prematch circuit 135_3. The third output prematch circuit 135_3 may be a high-pass output prematch (a shunt L-C, and a series L). For example, the shunt L-C of the third output prematch circuit 135_3 may be implemented by first bond wires 116 coupled between the second of the second transistor amplifier dies 115_2 and a capacitor 620_2. The bottom side of the capacitor 620_2 may be coupled to a ground plane of the amplifier package 100B, and the top side may be additionally coupled to a base-band decoupling capacitor 625_2. In some embodiments, the capacitor 620_2 may be a MOS capacitor. In some embodiments, the base-band decoupling capacitor 625_2 may be optional and omitted. The series L of the third output prematch circuit 135_3 may be implemented by second bond wires 117 coupled between the second of the second transistor amplifier dies 115_2 and the combined output lead 150A.

The combined output lead 150A may have a portion that is located within the amplifier package 100B. That is, the combined output lead 150A may extend from an interior of the amplifier package 100B to an exterior of the amplifier package 100B. The interior of the amplifier package 100B may include areas within sidewalls of the amplifier package 100B and/or encapsulated by a material (e.g., an overmold material) of the amplifier package 100B. In some embodiments, a width W of the combined output lead 150A may extend from a portion of the interior of the amplifier package 100B that is adjacent (e.g., overlapping in a horizontal direction) a first of the second transistor amplifier dies 115_1 to a portion of the interior of the amplifier package 100B that is adjacent (e.g., overlapping in a horizontal direction) a last of the second transistor amplifier dies 115_2. Stated another way, the combined output lead 150A may extend to at least partially overlap (e.g., in a horizontal direction) each of the second transistor amplifier dies 115 to which it is connected. As illustrated in FIG. 6A, the combined output lead 150A may provide a lateral edge 150e for the combination of the output signals of the second transistor amplifier dies 115_1, 115_2 discussed herein. The combined output lead 150A may allow for the output signals of the second transistor amplifier dies 115_1, 115_2 to be combined (e.g., in a Doherty fashion) before being output from the amplifier package 100B. In some embodiments, the use of the combined output lead 150A may allow for the base-band decoupling capacitor 625_2 to be shared between the second transistor amplifier dies 115_1, 115_2. Thus, separate base-band decoupling capacitors may not be necessary.

As discussed with respect to FIG. 5A, the series-L connections between the second transistor amplifier dies 115_1, 115_2 and the combined output lead 150A via bond wires 118, 117 may be used to adjust the phases of the output signals of the second transistor amplifier dies 115_1, 115_2 to be closer to one another, though not necessarily equal.

Figure 6B:
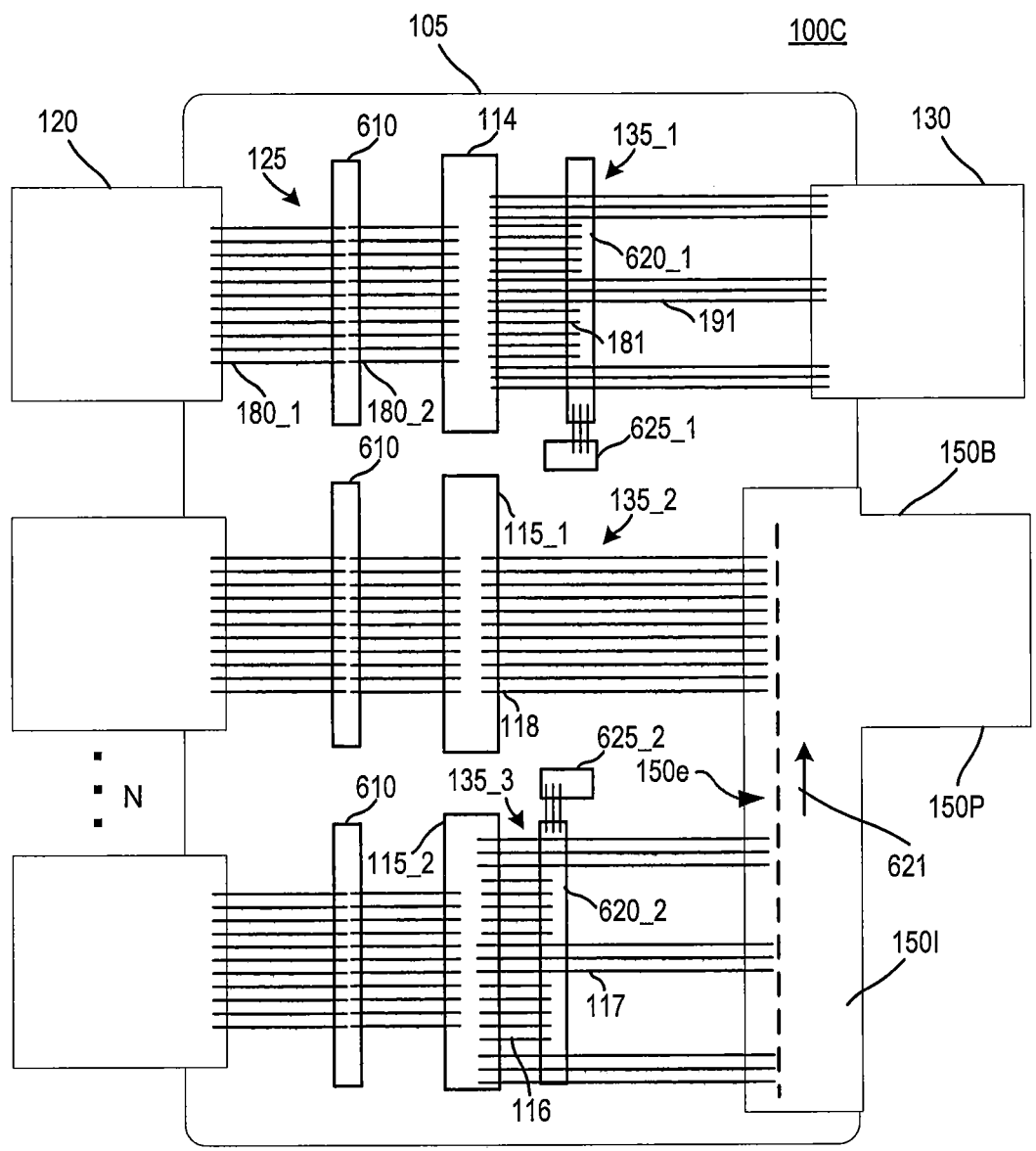

As discussed herein with respect to FIGS. 4A to 4D, the combined output lead 150 of the present disclosure can be implemented in a number of ways. FIG. 6B illustrates an example of an amplifier package 100C in which the combined output lead 150 is configured as a combined output lead 150B having a protrusion 150P. Elements of FIG. 6B previously described with respect to FIG. 6A, as well as other figures, will be omitted for brevity.

Referring to FIG. 6B, the amplifier package 100C may be similar to that of FIG. 6A, but the combined output lead 150B may be asymmetrically cut (e.g., has a first side that is asymmetric with respect to a second side) so that a protrusion 150P of the combined output lead 150B close to the one of the second transistor amplifier dies (e.g., a first of the second transistor amplifier dies 115_1) extends past the submount 105 to an exterior of the amplifier package 100B. In some embodiments, an internal portion 1501 of the combined output lead 150A may not extend past the submount 105. The RF signal from the second of the second transistor amplifier dies 115_2 may travel along a path 621 and combine with the RF signal from the first of the second transistor amplifier dies 115_1 near the protrusion 150P. The protrusion 150P is thus closer to one of the second transistor amplifier dies 115_1, 115_2. The combined signal from the second transistor amplifier dies 115_1, 115_2 may then travel along the protrusion 150P of the combined output lead 150B to an external output matching circuit, portions of which may be external to the amplifier package 100C.

The internal portion 1501 of the combined output lead 150B may still contain a lateral edge 150e that facilitates an easier connection of the bond wires and other circuit elements (such as elements of output prematch circuits 135). Thus, a size of the second transistor amplifier dies 115_1, 115_2 may change without requiring substantial changes to the configuration of the amplifier package 100C.

Figure 6C:
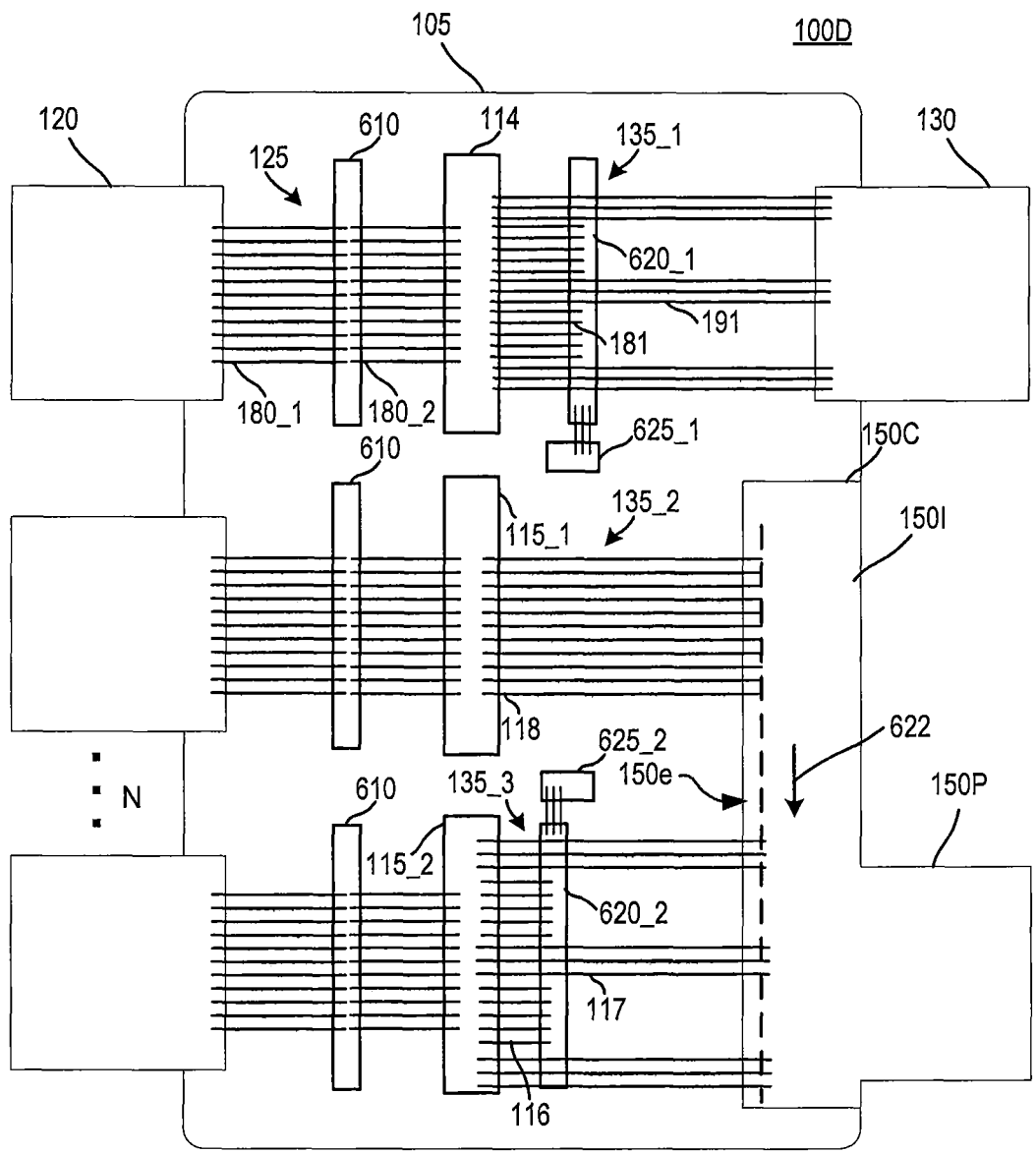

As discussed herein with respect to FIGS. 4B to 4D, one or more protrusions 150P may be provided in an asymmetric combined output lead 150 in various locations. FIG. 6C illustrates an example of an amplifier package 100D that is similar to that of FIG. 4C. As illustrated in FIG. 6C, the protrusion 150P may be closer to a second (e.g., a bottom-most) of the second transistor amplifier dies 115_2. The RF signal from the first of the second transistor amplifier dies 115_1 may travel along a path 622 and combine with the RF signal from the second of the second transistor amplifier dies 115_2 near the protrusion 150P. The combined signal from the second transistor amplifier dies 115_1, 115_2 may then travel along the protrusion 150P of the combined output lead 150C to an external output matching circuit, portions of which may be external to the amplifier package 100D.

Figure 6D:
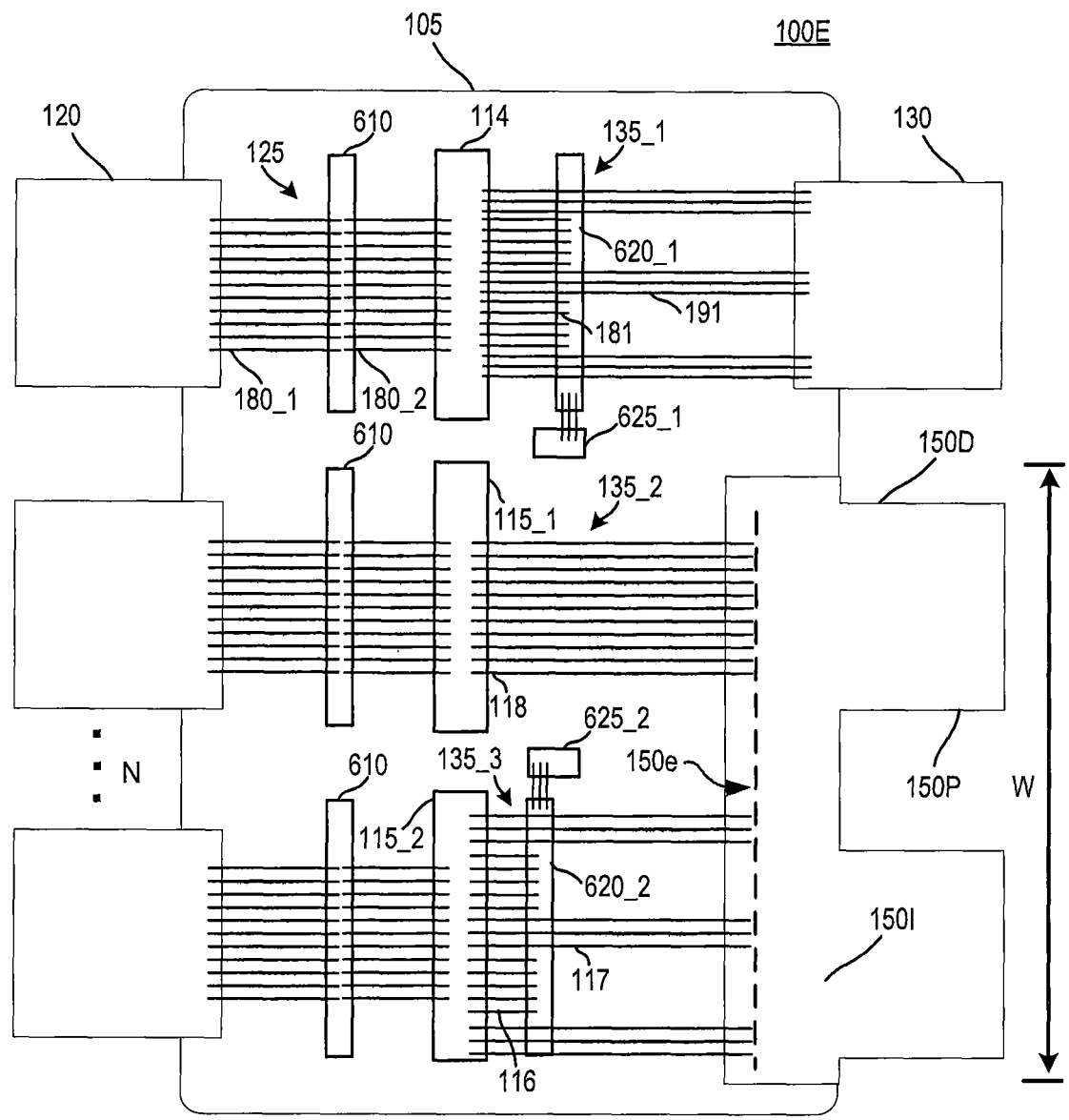

It will be understood that other configurations of the combined output lead 150, including those illustrated in FIGS. 4B to 4D, may be used without deviating from the scope of the present disclosure. For example, FIG. 6D illustrates an example of an amplifier package 100E incorporating a combined output lead 150D having a plurality of protrusions 150P. The implementation of the various circuit elements of the amplifier package 100E may be similar to those previously discussed and, as such, a description of duplicate elements will be omitted.

Referring to FIG. 6D, the combined output lead 150D may include one or more protrusions 150P extending from an internal portion 1501 of the combined output lead 150D. Though FIG. 6D illustrates two protrusions 150P, it will be understood that more (e.g., three or more) or fewer (e.g., one) protrusions 150P may be present. The internal portion 1501 of the combined output lead 150D may be within an interior of the amplifier package 100E. The interior of the amplifier package 100E may include areas within sidewalls of the amplifier package 100E and/or encapsulated by a material (e.g., an overmold material) of the amplifier package 100E.

A lateral edge 150e may extend along a lateral dimension of the internal portion 1501 of the combined output lead 150D. The lateral edge 150e may provide a surface that extends in a longitudinal direction to provide a bonding surface for the bond wires of the second transistor amplifier dies 115_1, 115_2. In some embodiments, a width W of the internal portion 1501 of the combined output lead 150D may extend from a portion of the interior of the amplifier package 100E that is adjacent (e.g., overlapping in a horizontal direction) a first of the second transistor amplifier dies 115_1 to a portion of the interior of the amplifier package 100E that is adjacent (e.g., overlapping in a horizontal direction) a last of the second transistor amplifier dies 115_2. Stated another way, the internal portion 150I of the combined output lead 150D may extend to at least partially horizontally overlap each of the second transistor amplifier dies 115 to which it is connected.

The one or more protrusions 150P may extend from the internal portion 150I to extend outside the amplifier package 100E so as to provide for external connections (e.g., to an output matching circuit). In some embodiments, the one or more protrusions 150P may be indistinguishable from the output lead 130 when viewed from outside the amplifier package 100E. The combined output lead 150D may combine the output signals of the second transistor amplifier dies 115_1, 115_2, and the combined output signal may be provided at each or a subset of the one or more protrusions 150P.

Figure 6E:
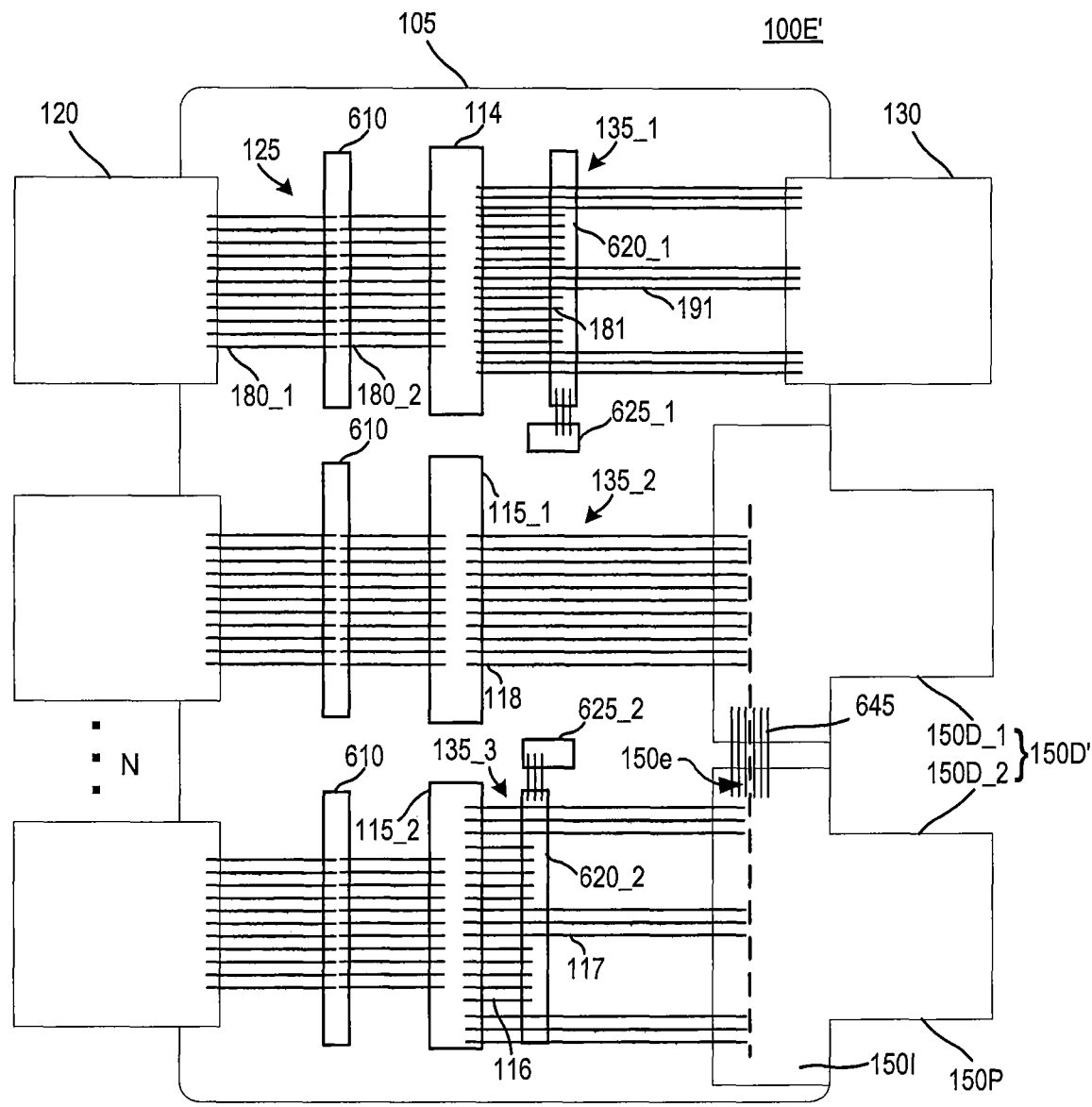

Though FIG. 6D illustrates the combined output lead 150D as a single unitary piece, the embodiments of the present disclosure are not limited thereto. In some embodiments, the combined output lead 150 may incorporate one or more separate pieces that are electrically connected together. FIG. 6E illustrates an embodiment of an amplifier package 100E' incorporating a combined output lead 150D' having a plurality of pieces.

Referring to FIG. 6E, the combined output lead 150D' may include a first portion 150D_1 and a second portion 150D_2. Each of the first and second portions 150D_1, 150D_2 may include an internal portion 150I that is located in an interior of the amplifier package 100E' and a protrusion 150P that extends from the interior to an exterior of the amplifier package 100E'. The first and second portions 150D_1, 150D_2 may be electrically connected together by a plurality of bond wires 645. The combination of the first portion 150D_1, the second portion 150D_2, and the bond wires 645 may provided a combined output lead 150D' having a lateral edge 150e (including the first portion 150D_1, the second portion 150D_2, and the bond wires 645) that is configured to combine the output signals of one or more of the second transistor amplifier dies 115_1, 115_2. In some embodiments, the first and second portions 150D_1, 150D_2 may be similar and/or identical to the output lead 130, however, the plurality of bond wires 645 may electrically connect them to provide the combined output lead 150D'.

Figure 7:
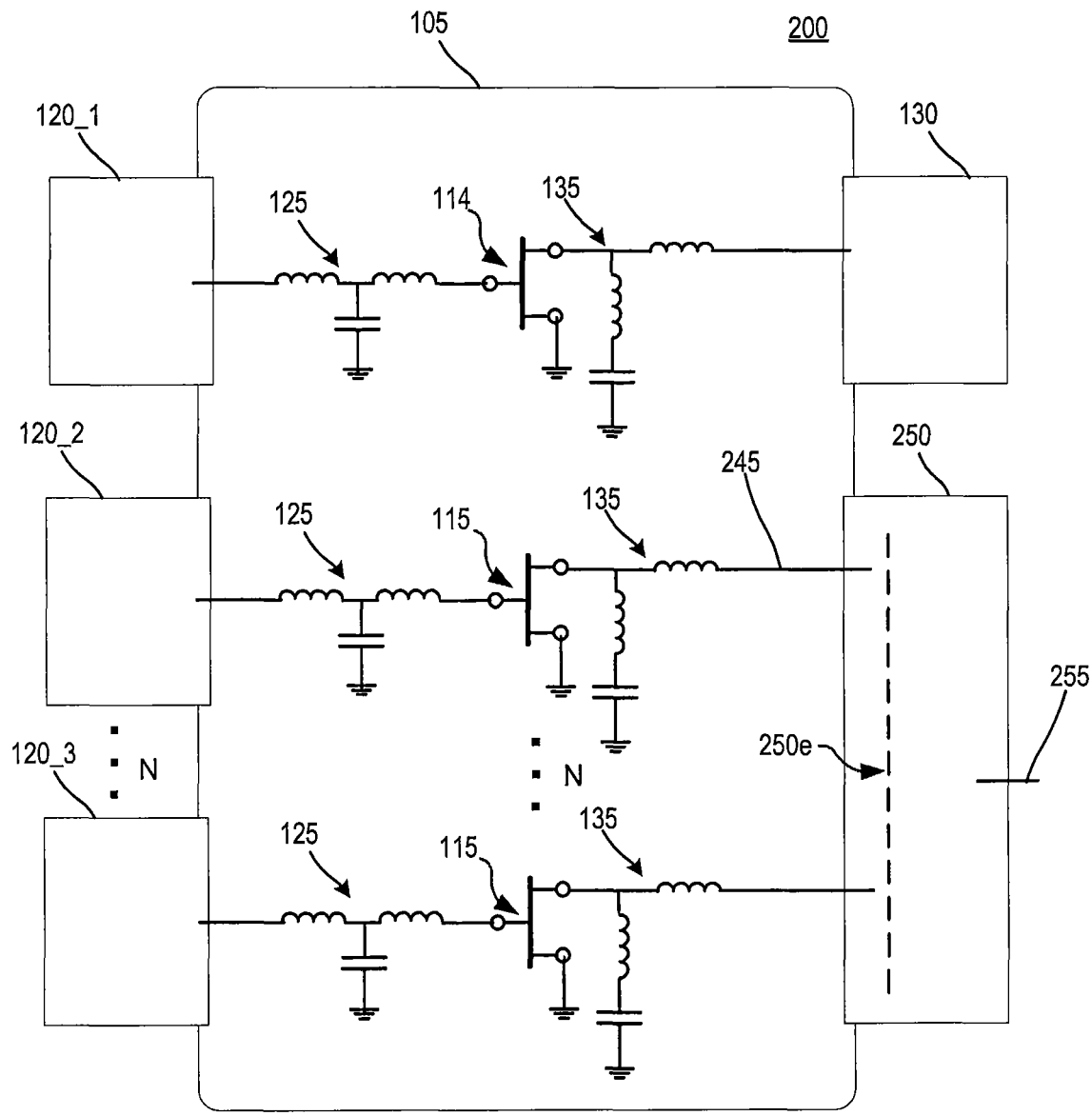
FIG. 7 is a schematic diagram of an amplifier package according to some embodiments of the present disclosure.

Though some of the embodiments described herein have incorporated an N-way Doherty amplifier, the amplifier packages of the present disclosure are not limited thereto. FIG. 7 is a schematic diagram of an amplifier package 200 according to some embodiments of the present disclosure. A description of elements of FIG. 7 that are the same or similar as previous elements will be omitted for brevity.

Referring to FIG. 7, the amplifier package 200 may include a plurality of transistor amplifier dies such as one or more first transistor amplifier dies 114 and one or more second transistor amplifier dies 115. In FIG. 7, one first transistor amplifier die 114 and N second transistor amplifier dies 115 are illustrated, but the present disclosure is not limited thereto.

The embodiment of FIG. 7 may be different from the embodiment of FIG. 3 in that each of the first and second transistor amplifier dies 114, 115 may be coupled to identical input prematch circuits 125 and identical output prematch circuits 135. The second transistor amplifier dies 115 may still be coupled to a combined output lead 250 including an edge plane 250e configured to combine the output signals 245 from the second transistor amplifier dies 115.

The embodiment of FIG. 7 may couple the second transistor amplifier dies 115 in parallel. The amplifier package 200 may be configured such that the input leads 120_2, 120_3 coupled to the second transistor amplifier dies 115 may be configured to receive the peaking amplifier signal while the input lead 120_1 coupled to the first transistor amplifier die 114 may be configured to receive the main amplifier signal. The signals provided to the input leads 120_2, 120_3 may be configured to be out-of-phase (e.g., by 90 degrees) with the signal provided to the input lead 120_1, but the signals provided to the input leads 1202, 120_3 may be in phase with one another. Thus, rather than acting as a N-way Doherty amplifier with N−1 peaking amplifiers (e.g., a 3-way Doherty amplifier with two peaking amplifiers), the amplifier package 200 will act as a 2:1 asymmetric Doherty amplifier. The combined output lead 250 may combine the output signals 245 of the second transistor amplifier dies 115 to generate a combined signal that may be provided to an output matching network and/or combining circuit.

The amplifier package 200 may allow for a simpler configuration of a 2-way Doherty while allowing for the asymmetric nature of the Doherty amplifier to be accomplished through the parallel combination of multiple transistor amplifier dies. Another advantage may include increased stability. By combining the outputs internally to the amplifier package 200 using combined output lead 250, the outputs are combined at a lower impedance than if they were combined external to the amplifier package 200. This technique may be used to change and/or improve an odd-mode instability situation.

Previous embodiments have described the use of a combination circuit to combine signals between a plurality of peaking amplifiers of an N-way Doherty amplifier, but the embodiments of the present disclosure are not limited thereto. In some embodiments, each of the amplifiers of the Doherty amplifier (e.g., the main and the peaking amplifiers) may be combined using a combination circuit.

Figure 8:
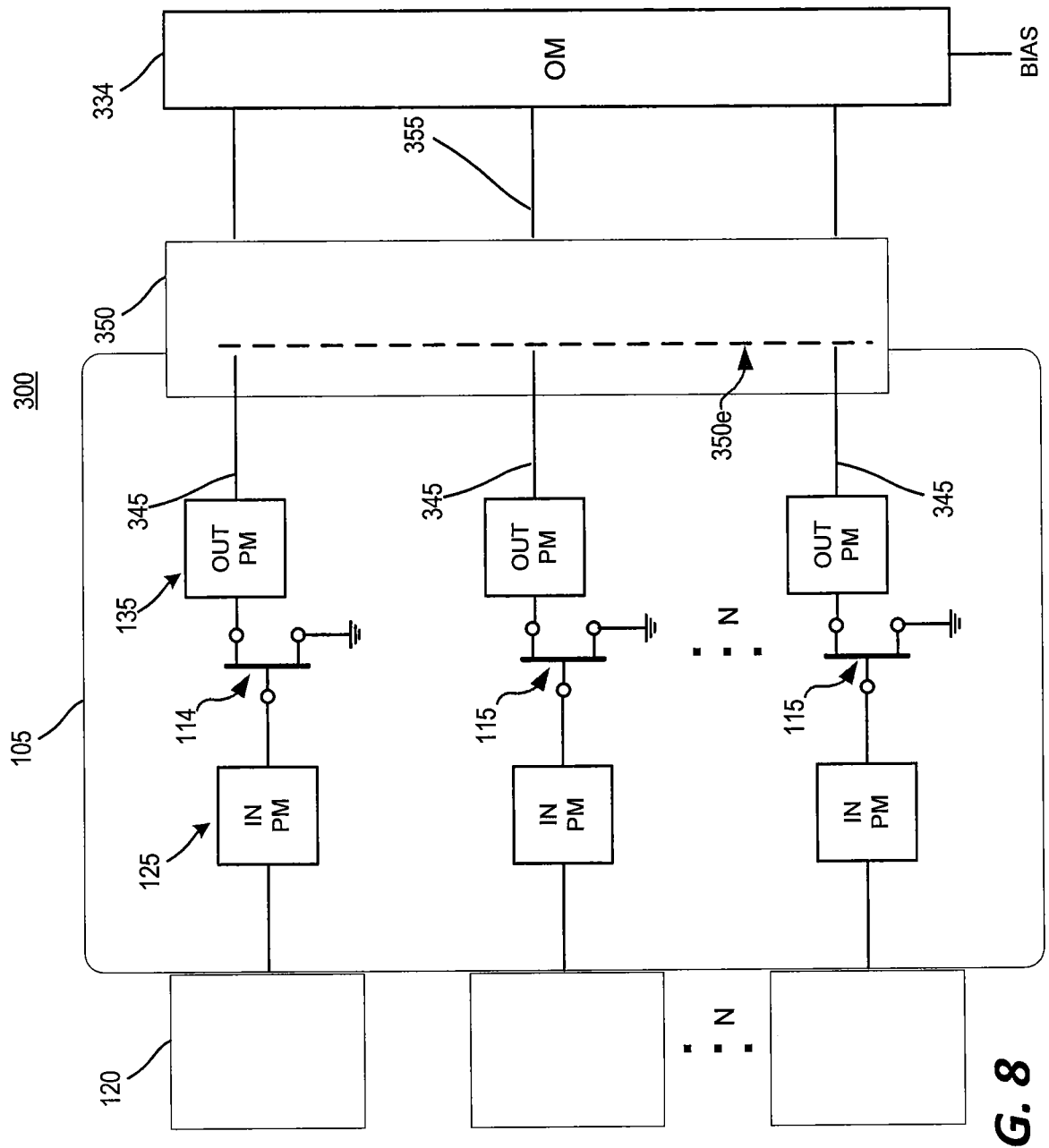
FIG. 8 is a schematic diagram of an amplifier package according to some embodiments of the present disclosure.

FIG. 8 is a schematic diagram of an amplifier package 300 according to some embodiments of the present disclosure.

Referring to FIG. 8, the amplifier package 300 may include a plurality of transistor amplifier dies such as one or more first transistor amplifier dies 114 and one or more second transistor amplifier dies 115. In FIG. 8, one first transistor amplifier die 114 and N second transistor amplifier dies 115 are illustrated, but the present disclosure is not limited thereto. In some embodiments, the amplifier package 300 may be a Doherty amplifier, and the one or more first transistor amplifier dies 114 may be main amplifier dies and the one or more second transistor amplifier dies 115 may be peaking amplifier dies. In such embodiments, the one or more first transistor amplifier dies 114 may be biased differently than the one or more second transistor amplifier dies 115. In some embodiments, the one or more second transistor amplifier dies 115 may each have a same size of transistor amplifier die. In some embodiments, the one or more first transistor amplifier dies 114 may have a different die size than the one or more second transistor amplifier dies 115. In some embodiments, each of the first and second transistor amplifier dies 114, 115 may have a same size of transistor amplifier die.

The one or more first transistor amplifier dies 114 and the one or more second transistor amplifier dies 115 may be disposed on a submount 105 of the amplifier package 300.

The submount 105 may be similar to that described herein (e.g., with respect to FIG. 3) and a duplicate description thereof will be omitted. Though not expressly illustrated in FIG. 8, the amplifier package 300 may include sidewalls to form an open cavity into which the first and second transistor amplifier dies 114, 115 are placed and/or the amplifier package 300 may include a plastic overmold that at least partially surrounds the first and second transistor amplifier dies 114, 115.

The amplifier package 300 may include input leads 120 and a combined output lead 350. Respective ones of the input leads 120 may be coupled to a control terminal (e.g., a gate) of the first transistor amplifier dies 114 or the second transistor amplifier dies 115. In some embodiments, an input prematch circuit 125 may be coupled between respective ones of the input leads 120 and respective ones of the first or second transistor amplifier dies 114, 115. In some embodiments, the input prematch circuit 125 may be similar to that described herein (e.g., with respect to FIG. 3) and a duplicate description thereof will be omitted. The input prematch circuits 125 coupled to different ones of the second transistor amplifier dies 115 may be different from one another or ones of the input prematch circuits 125 may be the same.

Respective output terminals (e.g., a drain) of the first transistor amplifier die 114 and the second transistor amplifier dies 115 may be internally (e.g., internal to the amplifier package 300) combined by a combined output lead 350. The combined output lead 350 may be configured to combine the output signals 345 of the first and second transistor amplifier dies 114, 115 to generate a combined output signal 355. The combined output signal 355 may be provided by the combined output lead 350 to an output matching network 334 that is external to the amplifier package 300. Though the combined output lead 350 is illustrated as being a single wide output lead, the embodiments of the present disclosure are not limited thereto. In some embodiments, the combined output lead 350 may include one or more protrusions such as those illustrated in FIGS. 4B, 4C, 4D, 6B, and 6C.

A plurality of output prematch circuits 135 may be electrically connected between respective ones of the first and second transistor amplifier dies 114, 115 and the combined output lead 350. The output prematch circuits 135 may include a number of different elements. For example, in some embodiments, the output prematch circuits 135 may be configured in a manner similar to that of FIG. 3, but it will be understood that the embodiments of the present disclosure are not limited thereto. In some embodiments, one or more of output prematch circuit 135 may be configured similarly to the embodiments illustrated in FIGS. 5A to 5C. In some embodiments, the output prematch circuit 135 of one or more of the second transistor amplifier dies 115 may include a shunt L-C component similar to those previous discussed, but the embodiments of the present disclosure are not limited thereto. In some embodiments, the output prematch circuits 135 of each of the second transistor amplifier dies 115 may include a shunt L-C component and the first transistor amplifier die 114 may omit the shunt L-C and have only a series-L output prematch circuit 135, but the embodiments of the present disclosure are not limited thereto. Other output prematch circuits 135 may be implemented without deviating from the embodiments described herein.

In some embodiments, the combined output lead 350 may allow for a Doherty combination of the output signals of the first and second transistor amplifier dies 114, 115. For example, each of the output signals 345 from the first and second transistor amplifier dies 114, 115 may be electrically connected to the combined output lead 350. As discussed previously, an edge plane 350e of the combined output lead 350 may allow for a combination of the output signals 345 that leverages load modulation from a complex-to-complex load. That is to say that the load modulation from a complex-to-complex load provided by the combined output lead 350 may perform combinations of both the main and peaking amplifiers of a Doherty amplifier.

The combination of the output signals 345 first and second transistor amplifier dies 114, 115 internal to the amplifier package 300 to generate the combined output signal 355 may greatly simplify the output matching network. As illustrated in FIG. 8, a single output matching network 334 may be coupled to the combined output lead 350 of the amplifier package 300. The single output matching network 334 may be configured to perform output matching on the combined signals of the first and second transistor amplifier dies 114, 115. The use of a single output matching network 334 may allow for more space to be allocated to the output matching network 334. This may increase a flexibility of the amplifier package 300. In addition, the use of a single output matching network 334 may simplify biasing of the output matching network 334 and reduce the amount of space needed to provide biasing wiring.

Though the discussion of FIG. 8 has focused on the use of the combined output lead 350 with both the main and peaking amplifier a Doherty amplifier, the embodiments of the present disclosure are not limited thereto. In some embodiments, the first and second transistor amplifier dies 114, 115 may be configured as parallel-connected transistor amplifiers similar to that described herein with respect to FIG. 7, with an output combined by the combined output lead 350. In such embodiments, for example, the input signals provided to the input leads 120 may not be phase-shifted from one another as may be done with a conventional Doherty amplifier input. In addition, one or more of the output prematch circuits 135 may be different than those illustrated in FIG. 8.

Figure 10A:
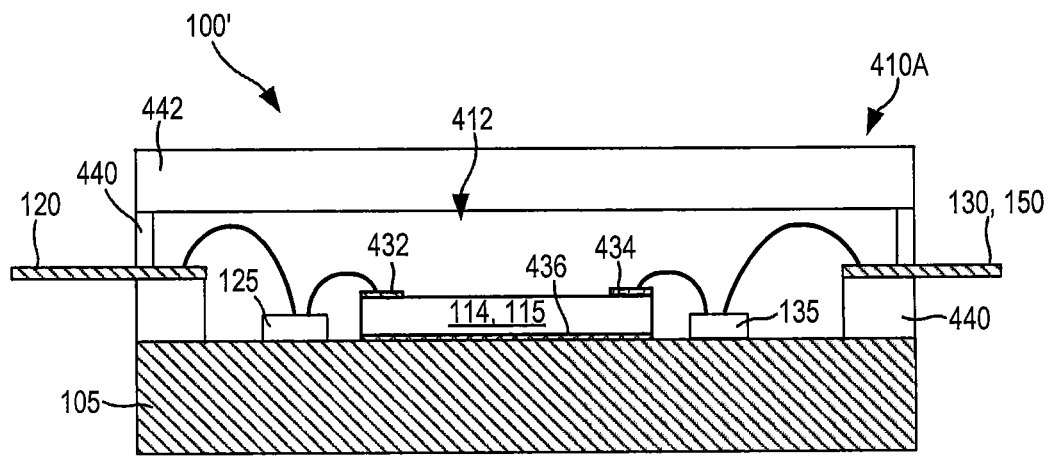
FIGS. 10A through 10C are schematic cross-sectional views illustrating several example ways that that the transistor amplifier dies according to embodiments of the present disclosure may be packaged to provide packaged transistor amplifiers.
Figure 10B:
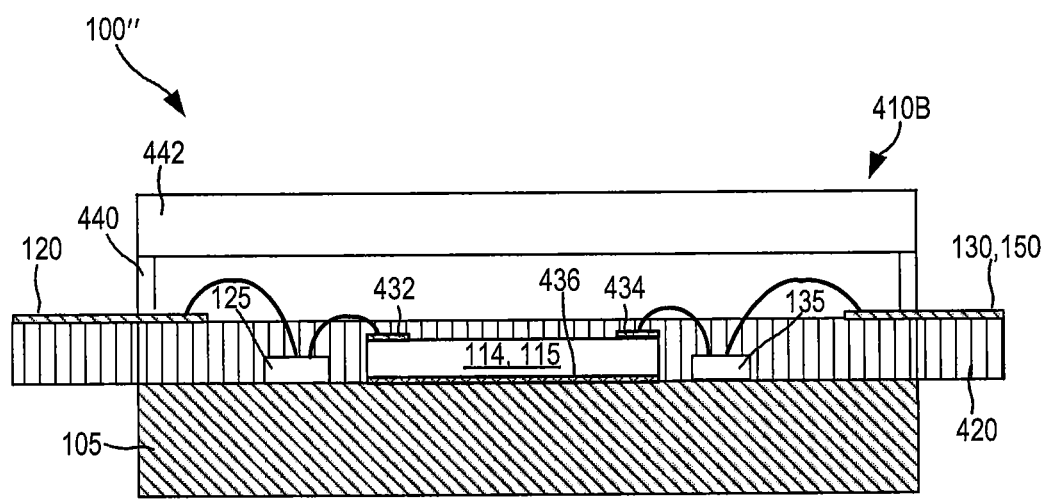
Figure 10C:
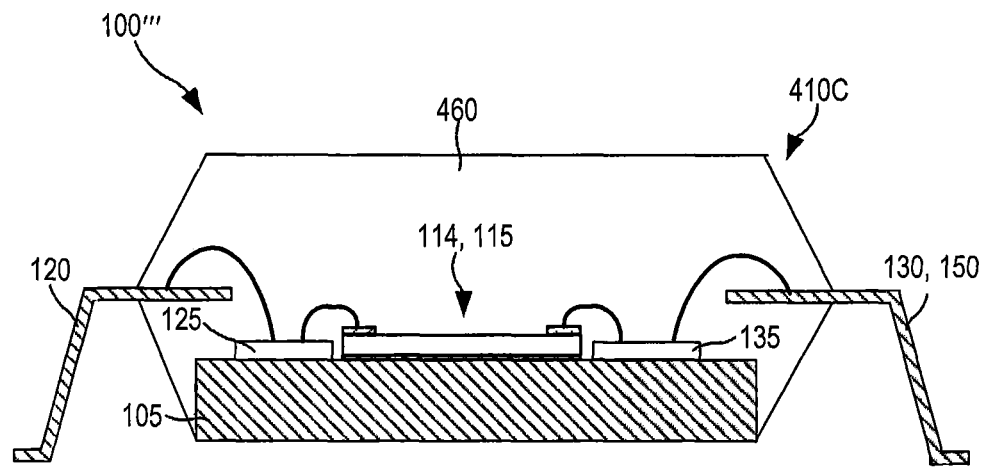

As discussed herein, the embodiments of the present disclosure may be utilized in any of a number of package formats. FIGS. 10A through 10C are schematic cross-sectional views illustrating several example ways that that the transistor amplifier dies according to embodiments of the present disclosure may be packaged to provide packaged transistor amplifiers. While FIGS. 10A-10C show variations of the amplifier package 100 of FIGS. 3-4D as an example, it will be appreciated that any of the package configurations according to embodiments of the present disclosure (e.g., amplifier packages 100A-100E', 200, 300) may be packaged in the packages illustrated in FIGS. 10A-10C.

FIG. 10A is a schematic side view of a packaged Group III nitride-based amplifier package 100'. As shown in FIG. 10A, amplifier package 100' includes one or more transistor amplifier die 114, 115 packaged in an open cavity package structure 410A. Though only one transistor amplifier die 114, 115 is illustrated in the cross-section, it will be understood that multiple transistor amplifier dies 114, 115 may be present. The package structure 410A includes metal input leads 120, metal output leads 130, 150, a metal submount 105, sidewalls 440 and a lid 442. Though only one input lead 120 is illustrated in the cross-section, it will be understood that multiple input leads 120 may be present. Similarly, though only one output lead 130, 150 is illustrated in the cross-section, it will be understood that multiple output leads 130, 150 may be present. As discussed herein, an output lead 130 and a combined output lead 150 may be present.

The submount 105 may include materials configured to assist with the thermal management of the package 100'. For example, the submount 105 may include copper and/or molybdenum. In some embodiments, the submount 105 may be composed of multiple layers and/or contain vias/interconnects. In an example embodiment, the submount 105 may be a multilayer copper/molybdenum/copper metal flange that comprises a core molybdenum layer with copper cladding layers on either major surface thereof. In some embodiments, the submount 105 may include a metal heat sink that is part of a lead frame or metal slug. The sidewalls 440 and/or lid 442 may be formed of or include an insulating material in some embodiments. For example, the sidewalls 440 and/or lid 442 may be formed of or include ceramic materials. In some embodiments, the sidewalls 440 and/or lid 442 may be formed of, for example, $Al_2O_3$. The lid 442 may be glued to the sidewalls 440 using an epoxy glue. The sidewalls 440 may be attached to the submount 105 via, for example, brazing. The input lead 120 and the output lead 130, 150 may be configured to extend through the sidewalls 442, though embodiments of the present disclosure are not limited thereto.

The transistor amplifier die 114, 115 is mounted on the upper surface of the metal submount 105 in an air-filled cavity 412 defined by the metal submount 105, the ceramic sidewalls 440 and the ceramic lid 442. In some embodiments, a gate terminal 432 and a drain terminal 434 of the transistor amplifier die 114, 115 are on the top side of the transistor amplifier die 114, 115, while a source terminal 436 is on the bottom side of the transistor amplifier die 114, 115. The source terminal 436 may be mounted on the metal submount 105 using, for example, a conductive die attach material (not shown). The metal submount 105 may provide the electrical connection to the source terminal 436 and may also serve as a heat dissipation structure that dissipates heat that is generated in the transistor amplifier die 114, 115. The heat is primarily generated in the upper portion of the transistor amplifier die 114, 115 where relatively high current densities are generated in, for example, the channel regions of the unit cell transistors of the transistor amplifier die 114, 115. This heat may be transferred, for example, though the source vias to the source terminal 436 and then to the metal submount 105.

Input prematch circuits 125 and/or output prematch circuits 135 may also be mounted within the package 100'. The prematch circuits 125, 135 may include impedance matching and/or harmonic termination circuits. The impedance matching circuits may be used to match the impedance of the fundamental component of RF signals that are input to or output from the RF transistor amplifier 100' to the impedance at the input or output of the transistor amplifier die 114, 115, respectively. The harmonic termination circuits may be used to ground harmonics of the fundamental signal that may be present at the input or output of the RF transistor amplifier die 114, 115. More than one input prematch circuit 125 and/or output prematch circuit 135 may be provided. As schematically shown in FIG. 10A, the input and output prematch circuits 125, 135 may be mounted on the metal submount 105, as discussed herein. The input lead 120 may be connected to the input prematch circuit 125 by one or more bond wires, and the input prematch circuit 125 may be connected to the gate terminal 432 of transistor amplifier die 114, 115 by one or more additional bond wires. Similarly, the output lead 130, 150 may be connected to the output prematch circuit 135 by one or more bond wires, and the output prematch circuit 135 may be connected to the drain terminal 434 of transistor amplifier die 114, 115 by one or more additional bond wires. The bond wires, which are inductive elements, may form part of the input and/or output prematch circuits.

FIG. 10B is a schematic side view of a packaged Group III nitride-based transistor amplifier 100" that includes the transistor amplifier die 114, 115 packaged in a printed circuit board based package structure 410B. The packaged transistor amplifier 100" of FIG. 10B is very similar to the packaged transistor amplifier 100' of FIG. 10A, except that the input leads 120 and output leads 130, 150 of package 100" are printed circuit board based leads 120, 130, 150 in package 100".

The package 100" includes a submount 105, ceramic sidewalls 440, a ceramic lid 442, each of which may be substantially identical to the like numbered elements of package 100' discussed above. The package 100" further includes a printed circuit board 420. Conductive traces on the printed circuit board 420 form an input lead 120 and an output lead 130, 150. The printed circuit board 420 may be attached to the submount 105 via, for example, a conductive glue. The printed circuit board 420 includes a central opening and the transistor amplifier die 114, 115 is mounted within this opening on the submount 105. Other components of the amplifier package 100" may be the same as the like-numbered components of the amplifier package 100', and hence further description thereof will be omitted.

FIG. 10C is a schematic side view of another packaged Group III nitride-based transistor amplifier 100'''. Amplifier package 100' differs from amplifier package 100' in that it includes a different package structure 410C. The package structure 410C includes a metal submount 105 (which may be similar or identical to the like numbered submount 105 of package 100'), as well as input leads 120 and output leads 130, 150. Amplifier package 100''' also includes a plastic overmold 460 that at least partially surrounds the transistor amplifier die 114, 115, the leads 120, 130, 150, and the metal submount 105. Other components of amplifier package 100''' may be the same as the like-numbered components of amplifier package 100' and hence further description thereof will be omitted.

While embodiments of the present invention are described above with respect to RF transistor amplifiers, it will be appreciated that embodiments of the present invention are not limited thereto. For example, the transistors described above may also be used as power transistors in switching and other applications.

Embodiments of the present invention have been described above with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

In the specification and the figures, two-part reference numbers (i.e., two numbers separated by a dash or underscore, such as 100-1, 100_1) may be used to identify like elements. When such two-part reference numbers are employed, the full reference numeral may be used to refer to a specific instance of the element, while the first part of the reference numeral may be used to refer to the elements collectively.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device package comprising:
a plurality of input leads;
a plurality of transistor amplifier dies having inputs respectively coupled to the plurality of input leads; and
a combined output lead comprising an edge plane that laterally extends between outputs of the plurality of transistor amplifier dies and is configured to output a combined signal from the semiconductor device package.

2. The semiconductor device package of claim 1, wherein the plurality of transistor amplifier dies are second transistor amplifier dies,
wherein the plurality of input leads are a plurality of second input leads, and
wherein the semiconductor device package further comprises:
a first input lead;
a first output lead separate from the combined output lead; and
a first transistor amplifier die coupled between the first input lead and the first output lead.

3. The semiconductor device package of claim 2, wherein the first transistor amplifier die is a main amplifier of a Doherty amplifier and the plurality of second transistor amplifier dies are peaking amplifiers of the Doherty amplifier.

4. The semiconductor device package of claim 1, wherein at least a portion of the combined output lead is within the semiconductor device package.

5. The semiconductor device package of claim 1, further comprising a plurality of output prematch circuits respectively between ones of the plurality of transistor amplifier dies and the combined output lead.

6. The semiconductor device package of claim 1, wherein the plurality of input leads are configured to receive a plurality of input signals that are respectively out of phase with one another.

7. The semiconductor device package of claim 1, further comprising a first output lead that is separate from the combined output lead, wherein:
the first output lead is configured to couple a first transistor amplifier die from among the plurality of transistor amplifier dies to a first output match circuit, and
the combined output lead is configured to couple a plurality of second transistor amplifier dies from among the plurality of transistor amplifier dies to a second output match circuit.

8. A semiconductor package comprising:
a plurality of input leads;
a plurality of transistor amplifier dies having inputs respectively coupled to the plurality of input leads; and
a combined output lead configured to combine output signals received from the plurality of transistor amplifier dies and output a combined signal, wherein the combined output lead comprises an internal portion that is within the semiconductor device package and a protrusion that extends from the internal portion out of the semiconductor device package.

9. The semiconductor device package of claim 8, wherein the protrusion is a first protrusion, and
wherein the combined output lead comprises a second protrusion, separated from the first protrusion, that extends from the internal portion of the combined output lead out of the semiconductor device package.

10. A semiconductor package comprising:
a plurality of input leads;
a plurality of transistor amplifier dies having inputs respectively coupled to the plurality of input leads; and
a combined output lead configured to combine output signals received from the plurality of transistor amplifier dies and output a combined signal, wherein a width of the combined output lead extends from a portion of an interior of the semiconductor device package that is adjacent a first of the plurality of transistor amplifier dies to a portion of the interior of the semiconductor device package that is adjacent a second of the plurality of transistor amplifier dies.

11. A semiconductor package comprising:
a plurality of input leads;
a plurality of transistor amplifier dies having inputs respectively coupled to the plurality of input leads; and
a combined output lead configured to combine output signals received from the plurality of transistor amplifier dies and output a combined signal, wherein the combined output lead extends to at least partially overlap each of the plurality of transistor amplifier dies.

12. A semiconductor device package comprising:
a first transistor amplifier die coupled to a first input lead of the semiconductor device package;
a plurality of second transistor amplifier dies respectively coupled to a plurality of second input leads of the semiconductor device package; and
a combined output lead that is configured to output a combination of output signals of respective ones of the plurality of second transistor amplifier dies,
wherein the combined output lead comprises an internal portion that is within the semiconductor device package and extends along the plurality of second transistor amplifier dies.

13. The semiconductor device package of claim 12, wherein the semiconductor device package is a Doherty amplifier package,
wherein the plurality of second transistor amplifier dies comprise a first peaking transistor amplifier and a second peaking transistor amplifier of the Doherty amplifier package, and
wherein the first transistor amplifier die comprises a main amplifier of the Doherty amplifier package.

14. The semiconductor device package of claim 12, wherein the combined output lead is further configured to combine the output of the first transistor amplifier die with the combination of the output of the plurality of second transistor amplifier dies.

15. The semiconductor device package of claim 12, wherein the combined output lead comprises a first output lead and a second output lead electrically coupled together.

16. The semiconductor device package of claim 15, wherein the first output lead and the second output lead are electrically coupled together by bond wires.

17. The semiconductor device package of claim 12, wherein the combined output lead further comprises a protrusion that extends from the internal portion out of the semiconductor device package.

18. The semiconductor device package of claim 12, further comprising an output prematch circuit between respective ones of the plurality of second transistor amplifier dies and the combined output lead.

19. A semiconductor device package comprising:
a plurality of transistor amplifier dies, each respectively coupled to one of a plurality of input leads of the semiconductor device package; and
a combined output lead configured to combine output signals from two or more of the plurality of transistor amplifier dies to generate a combined output signal that is provided as an output of the semiconductor device package,
wherein the combined output lead extends to at least partially overlap the two or more of the plurality of transistor amplifier dies.

20. The semiconductor device package of claim 19, further comprising a plurality of output prematch circuits respectively between ones of the plurality of transistor amplifier dies and the combined output lead.

21. The semiconductor device package of claim 19, wherein the plurality of transistor amplifier dies are second transistor amplifier dies,
wherein the plurality of input leads are a plurality of second input leads, and
wherein the semiconductor device package further comprises:
a first input lead;
a first output lead separate from the combined output lead; and
a first transistor amplifier die coupled between the first input lead and the first output lead.

22. The semiconductor device package of claim 21, wherein the first transistor amplifier die is a main amplifier of a Doherty amplifier and the plurality of second transistor amplifier dies are peaking amplifiers of the Doherty amplifier.

23. The semiconductor device package of claim 21, wherein the combined output lead is further configured to combine the output signals from the two or more of the plurality of second transistor amplifier dies with an output signal of the first transistor amplifier die to generate the combined output signal.

* * * * *

UNITED STATES PATENT AND TRADEMARK OFFICE
CERTIFICATE OF CORRECTION

PATENT NO. : 11,967,936 B2
APPLICATION NO. : 17/313616
DATED : April 23, 2024
INVENTOR(S) : Marbell et al.

It is certified that error appears in the above-identified patent and that said Letters Patent is hereby corrected as shown below:

In the Specification

Column 13, Line 30: Please correct "1501" to read --150I--

Column 13, Line 37: Please correct "1501" to read --150I--

Column 13, Line 38: Please correct "1501" to read --150I--

Column 13, Line 40: Please correct "1501" to read --150I--

Column 13, Line 44: Please correct "1501" to read --150I--

Column 13, Line 47: Please correct "1501" to read --150I--

Column 13, Line 56: Please correct "1501" to read --150I--

Column 13, Line 62: Please correct "1501" to read --150I--

Column 18, Line 5: Please correct "1501" to read --150I--

Column 18, Line 17: Please correct "1501" to read --150I--

Column 18, Line 51: Please correct "1501" to read --150I--

Column 18, Line 55: Please correct "1501" to read --150I--

Column 18, Line 62: Please correct "1501" to read --150I--

Column 18, Line 67: Please correct "1501" to read --150I--

Signed and Sealed this
Twenty-first Day of January, 2025

Coke Morgan Stewart
*Acting Director of the United States Patent and Trademark Office*

CERTIFICATE OF CORRECTION (continued)
U.S. Pat. No. 11,967,936 B2

Column 19, Line 7: Please correct "1501" to read --150I--

Column 19, Line 12: Please correct "1501" to read --150I--

Column 19, Line 33: Please correct "1501" to read --150I--

Column 24, Line 32: Please correct "package 100' differs" to read --package 100''' differs--